(12) United States Patent
Yeh et al.

(10) Patent No.: US 10,074,629 B2
(45) Date of Patent: Sep. 11, 2018

(54) SYSTEM ON INTEGRATED CHIPS AND METHODS OF FORMING SAME

(71) Applicant: Taiwan Semiconductor Manufacturing Company, Ltd., Hsin-Chu (TW)

(72) Inventors: Sung-Feng Yeh, Taipei (TW); Chen-Hua Yu, Hsin-Chu (TW); Ming-Fa Chen, Taichung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/379,590

(22) Filed: Dec. 15, 2016

(65) Prior Publication Data

US 2017/0125376 A1 May 4, 2017

Related U.S. Application Data

(63) Continuation of application No. 14/960,225, filed on Dec. 4, 2015, now Pat. No. 9,524,959.

(60) Provisional application No. 62/250,963, filed on Nov. 4, 2015.

(51) Int. Cl.
| | |
|---|---|
| *H01L 23/538* | (2006.01) |
| *H01L 25/065* | (2006.01) |
| *H01L 23/31* | (2006.01) |
| *H01L 23/00* | (2006.01) |
| *H01L 25/00* | (2006.01) |
| *H01L 21/48* | (2006.01) |
| *H01L 21/56* | (2006.01) |

(52) U.S. Cl.
CPC ........ *H01L 25/0652* (2013.01); *H01L 21/486* (2013.01); *H01L 21/4853* (2013.01); *H01L 21/4857* (2013.01); *H01L 21/565* (2013.01); *H01L 23/3114* (2013.01); *H01L 23/5383* (2013.01); *H01L 23/5384* (2013.01); *H01L 23/5386* (2013.01); *H01L 23/5389* (2013.01); *H01L 24/83* (2013.01); *H01L 25/50* (2013.01); *H01L 2224/83896* (2013.01); *H01L 2225/06524* (2013.01); *H01L 2225/06548* (2013.01); *H01L 2225/06555* (2013.01); *H01L 2225/06582* (2013.01)

(58) Field of Classification Search
CPC ............. H01L 23/5383; H01L 23/5384; H01L 23/5386; H01L 23/5389
See application file for complete search history.

(56) References Cited

U.S. PATENT DOCUMENTS

| | | |
|---|---|---|
| 8,361,842 B2 | 1/2013 | Yu et al. |
| 8,680,647 B2 | 3/2014 | Yu et al. |
| 8,703,542 B2 | 4/2014 | Lin et al. |
| 8,759,964 B2 | 6/2014 | Pu et al. |
| 8,778,738 B1 | 7/2014 | Lin et al. |

(Continued)

*Primary Examiner* — Douglas Menz
(74) *Attorney, Agent, or Firm* — Slater Matsil, LLP

(57) ABSTRACT

An embodiment method for forming a semiconductor package includes attaching a first die to a first carrier, depositing a first isolation material around the first die, and after depositing the first isolation material, bonding a second die to the first die. Bonding the second die to the first die includes forming a dielectric-to-dielectric bond. The method further includes removing the first carrier and forming fan-out redistribution layers (RDLs) on an opposing side of the first die as the second die. The fan-out RDLs are electrically connected to the first die and the second die.

20 Claims, 35 Drawing Sheets

(56) References Cited

U.S. PATENT DOCUMENTS

| | | |
|---|---|---|
| 8,785,299 B2 | 7/2014 | Mao et al. |
| 8,803,306 B1 | 8/2014 | Yu et al. |
| 8,809,996 B2 | 8/2014 | Chen et al. |
| 8,829,676 B2 | 9/2014 | Yu et al. |
| 8,877,554 B2 | 11/2014 | Tsai et al. |
| 2011/0291288 A1 | 12/2011 | Wu et al. |
| 2013/0026468 A1 | 1/2013 | Yoshimuta et al. |
| 2013/0062760 A1 | 3/2013 | Hung et al. |
| 2013/0062761 A1 | 3/2013 | Lin et al. |
| 2013/0168848 A1 | 7/2013 | Lin et al. |
| 2013/0307140 A1 | 11/2013 | Huang et al. |
| 2014/0203429 A1 | 7/2014 | Yu et al. |
| 2014/0225222 A1 | 8/2014 | Yu et al. |
| 2014/0252646 A1 | 9/2014 | Hung et al. |
| 2014/0264930 A1 | 9/2014 | Yu et al. |

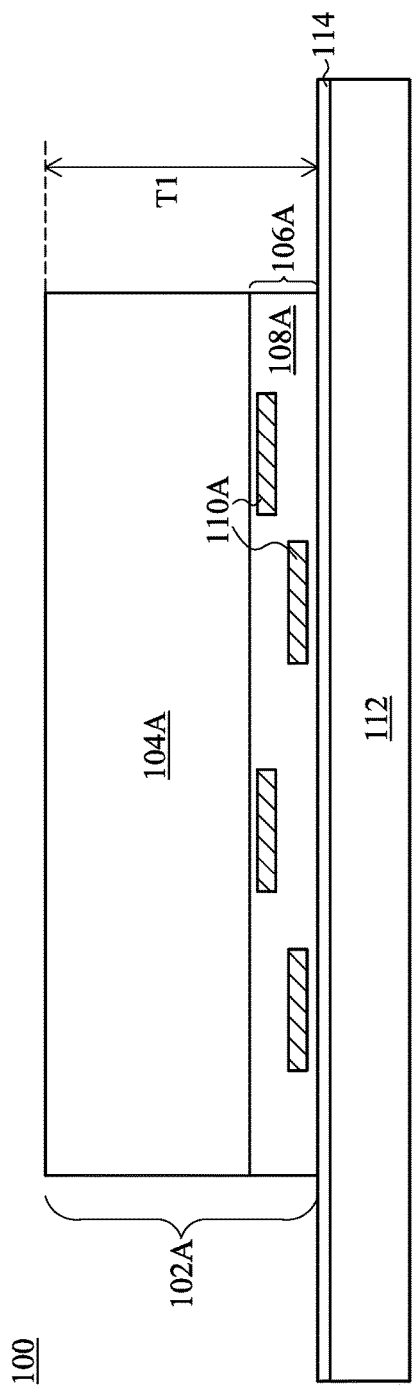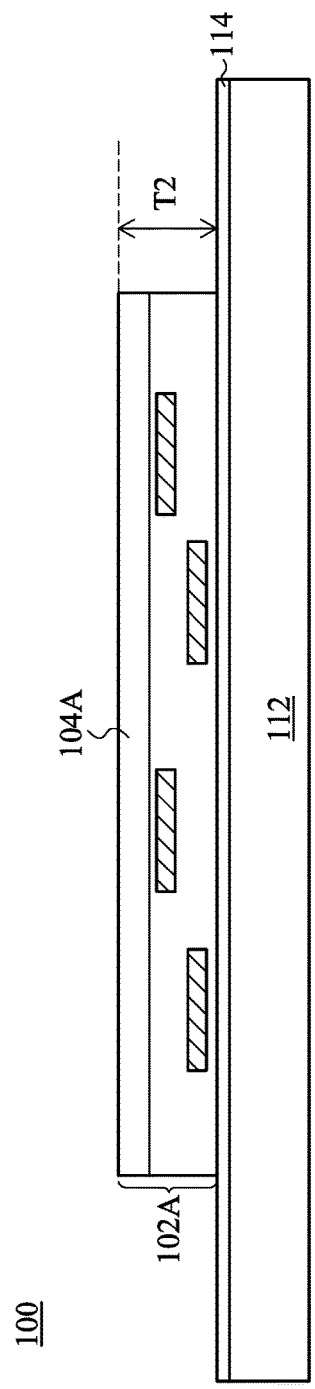

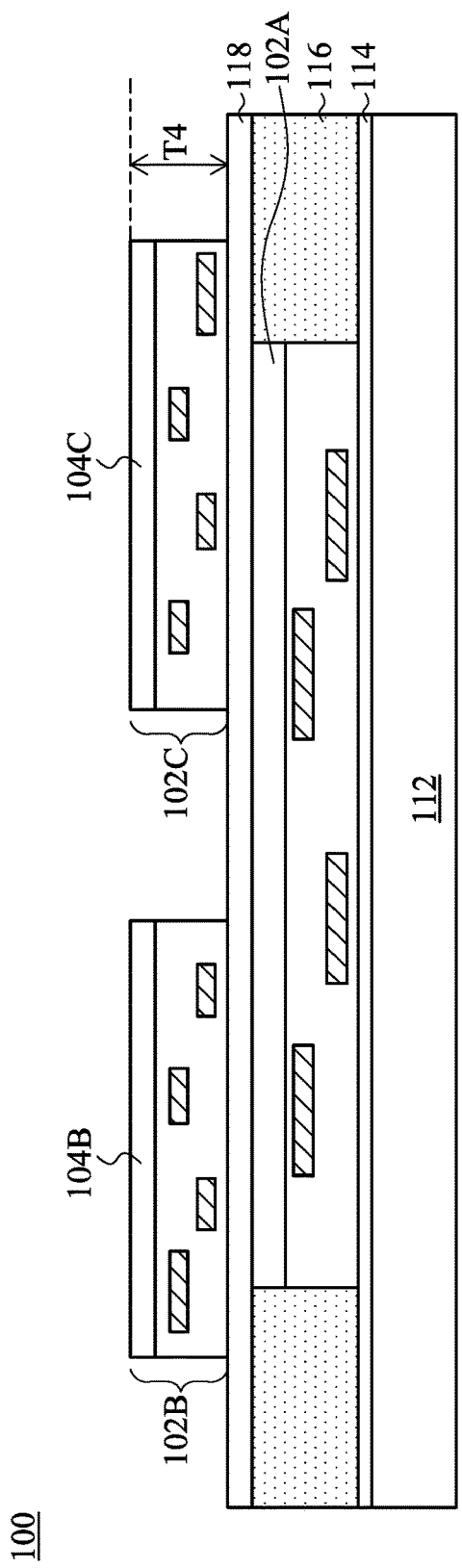
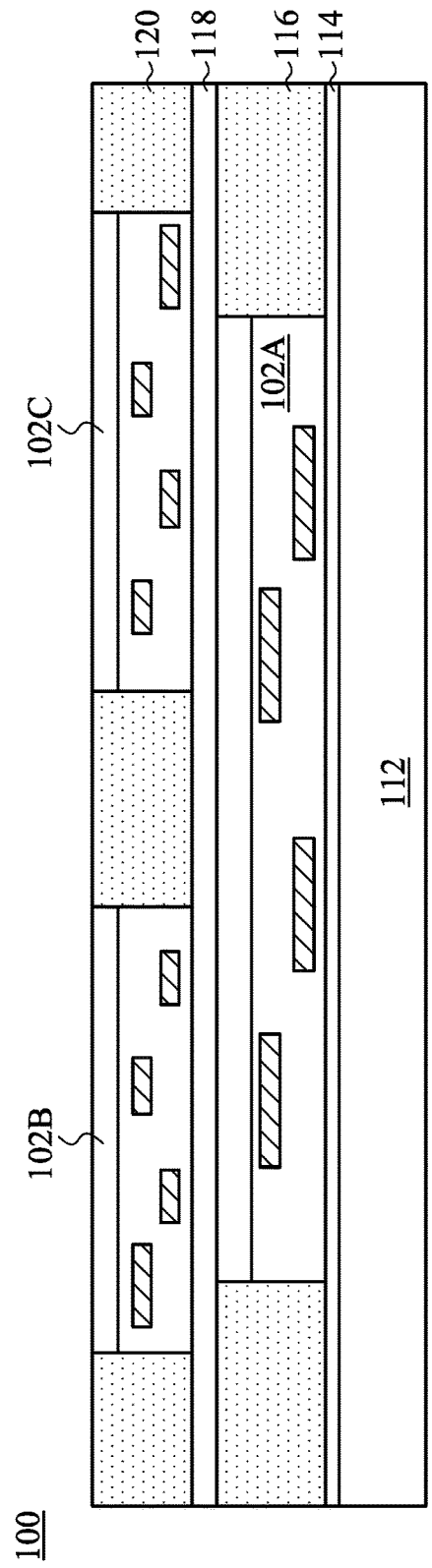
FIG. 5
FIG. 6

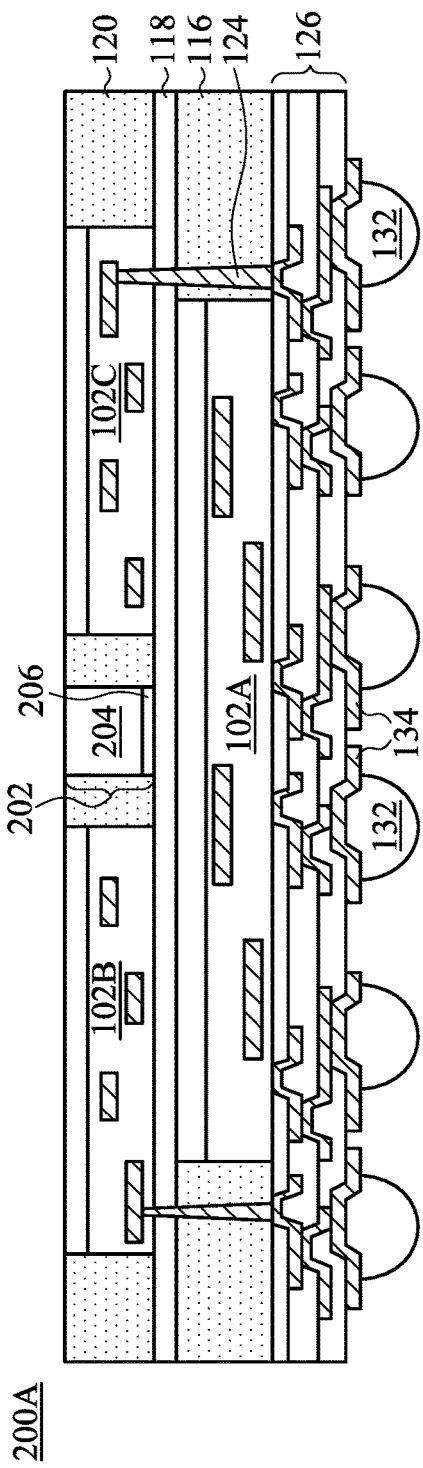
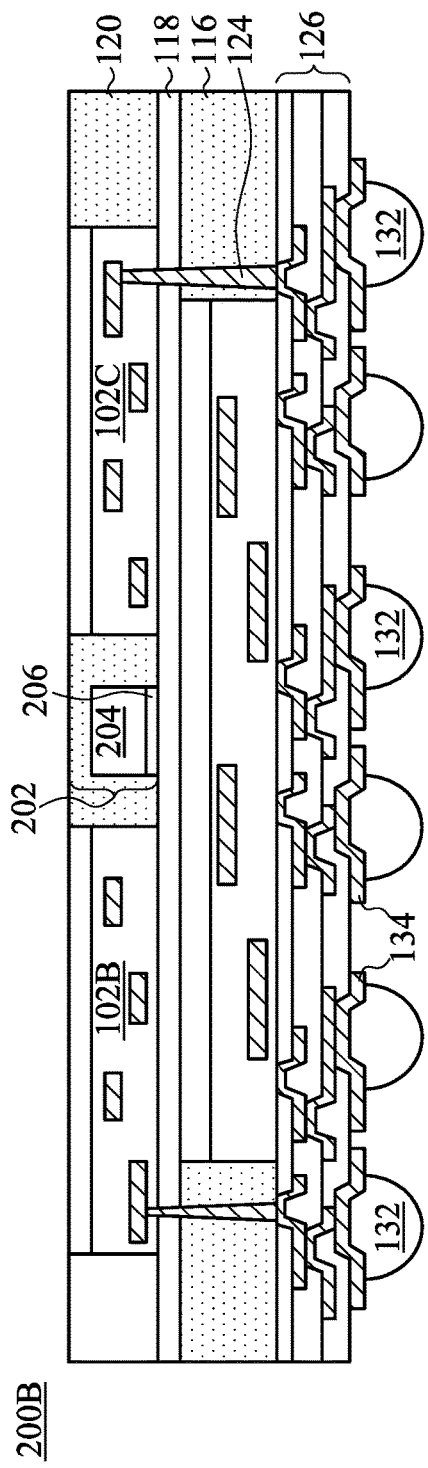
FIG.11A
FIG.11B

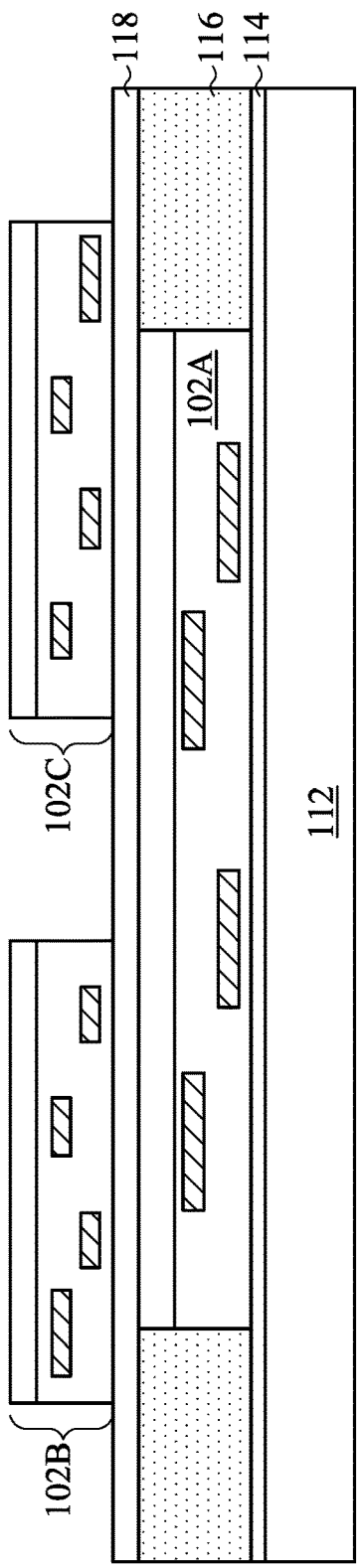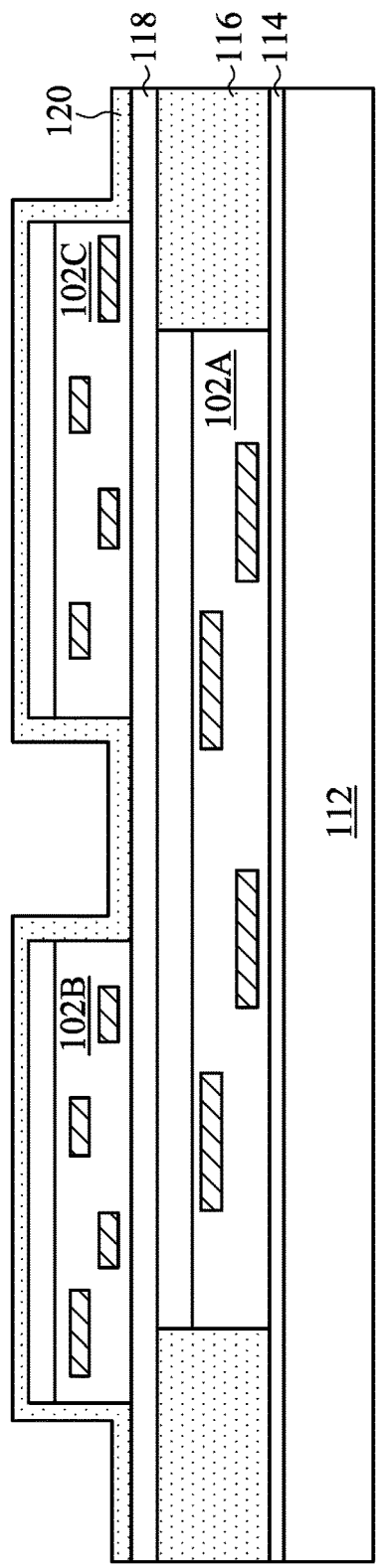

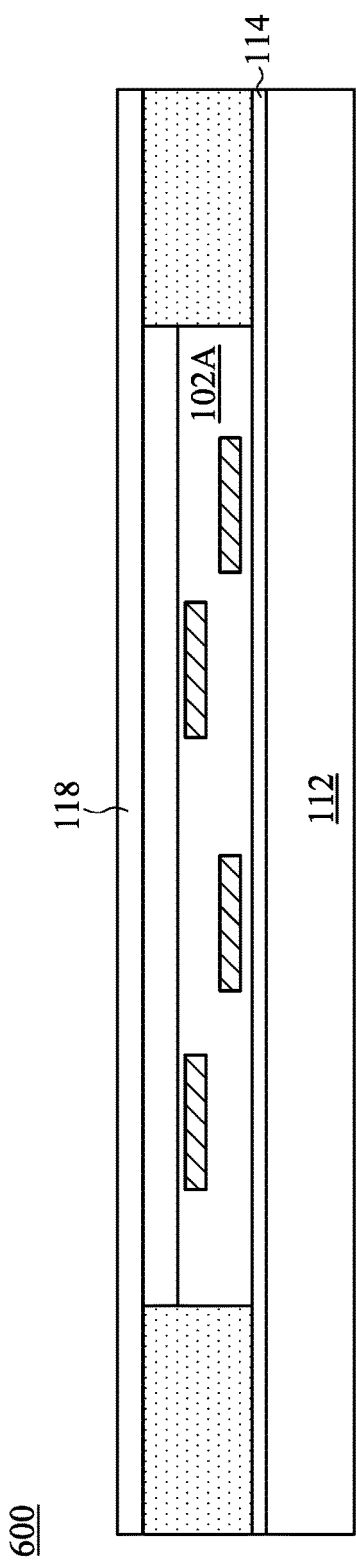
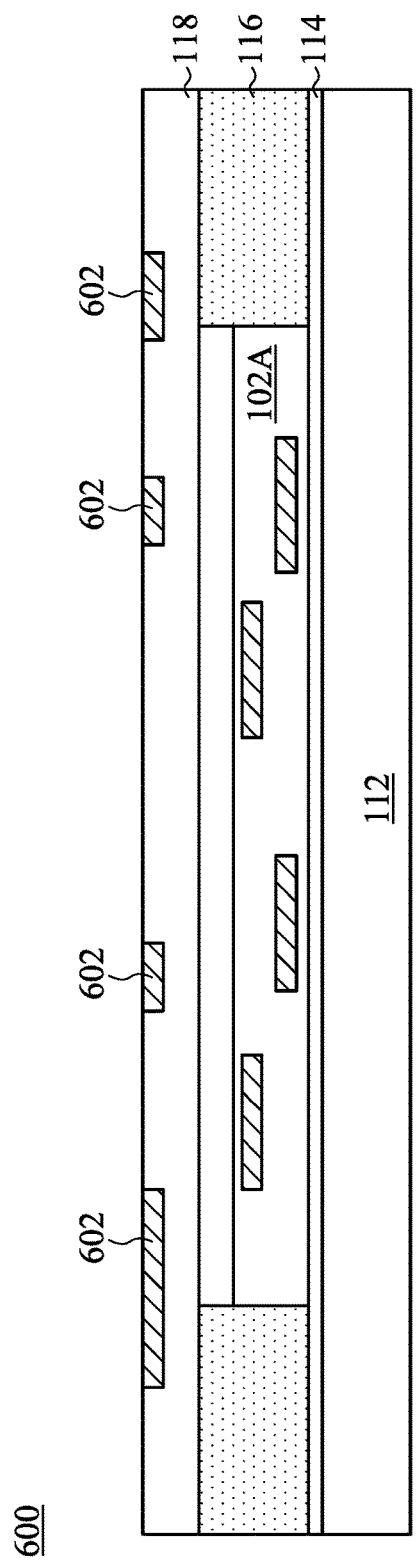

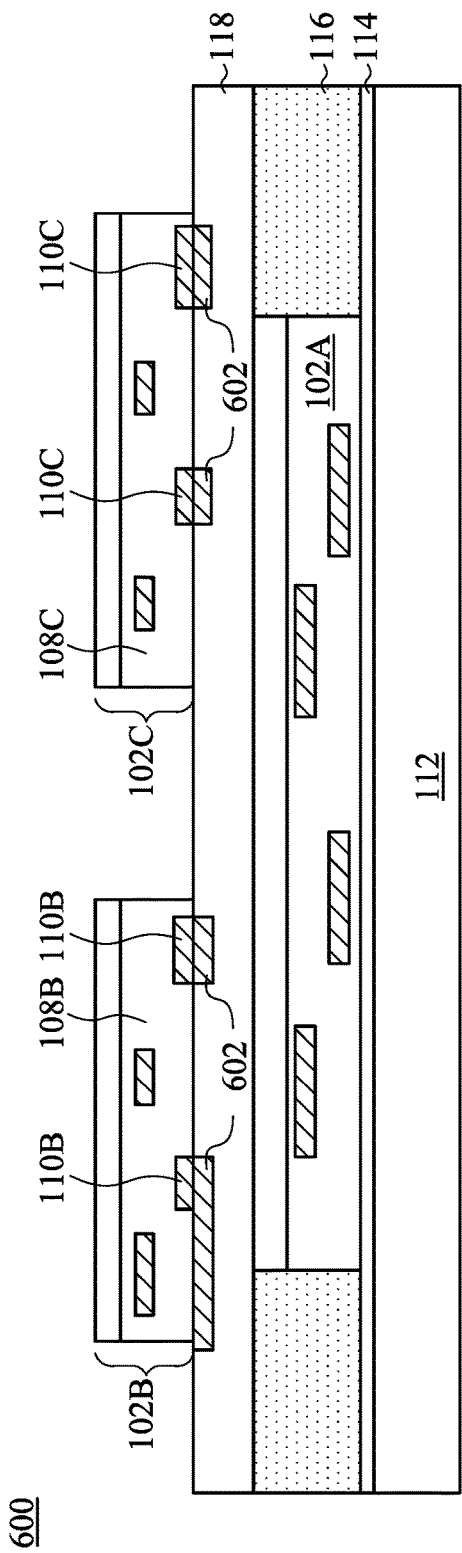
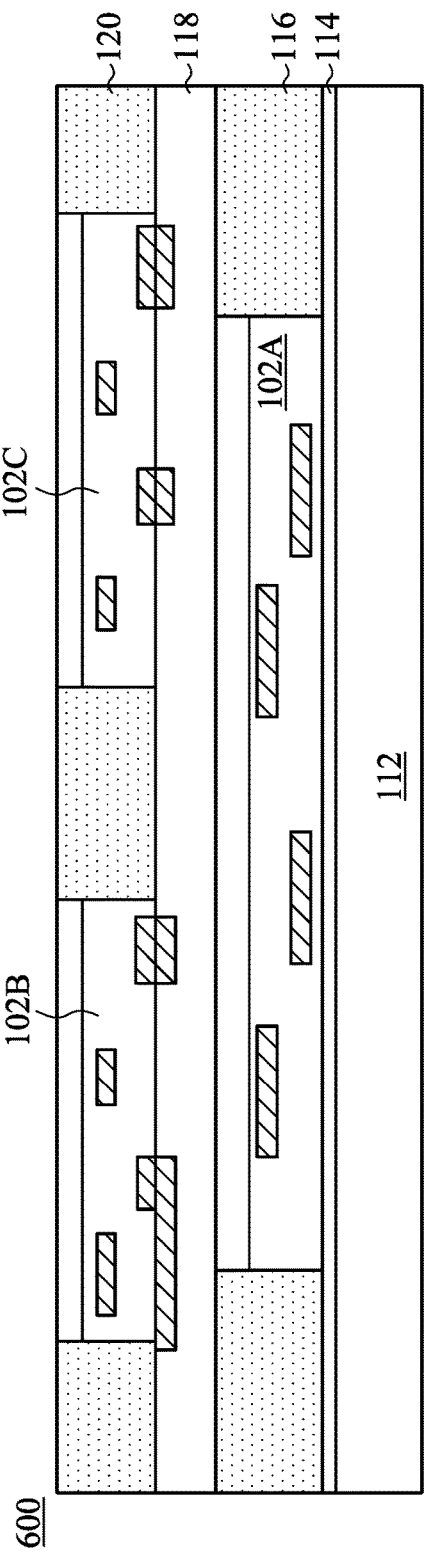

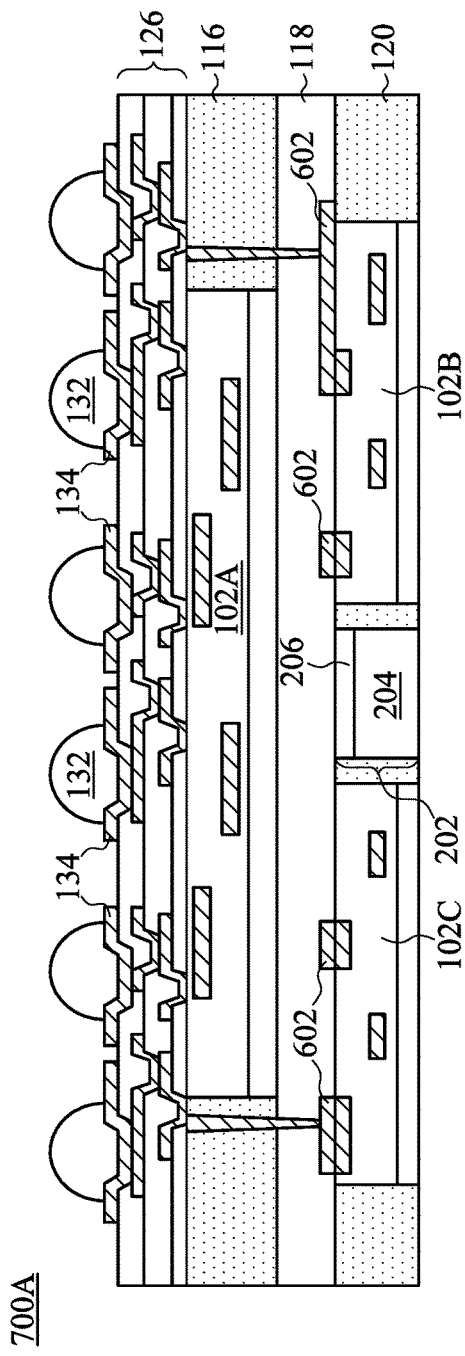
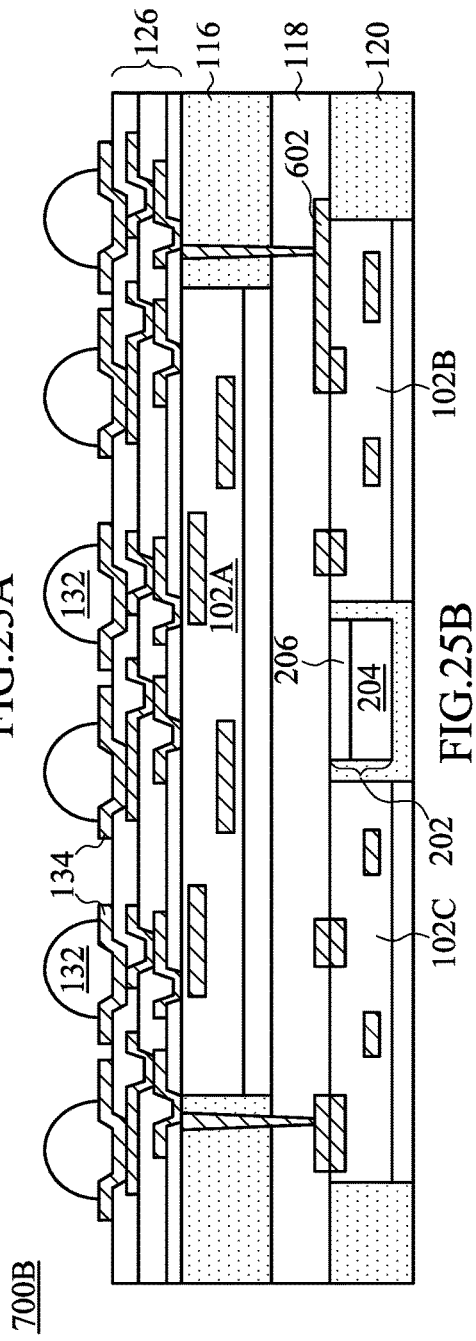
FIG.25A
FIG.25B

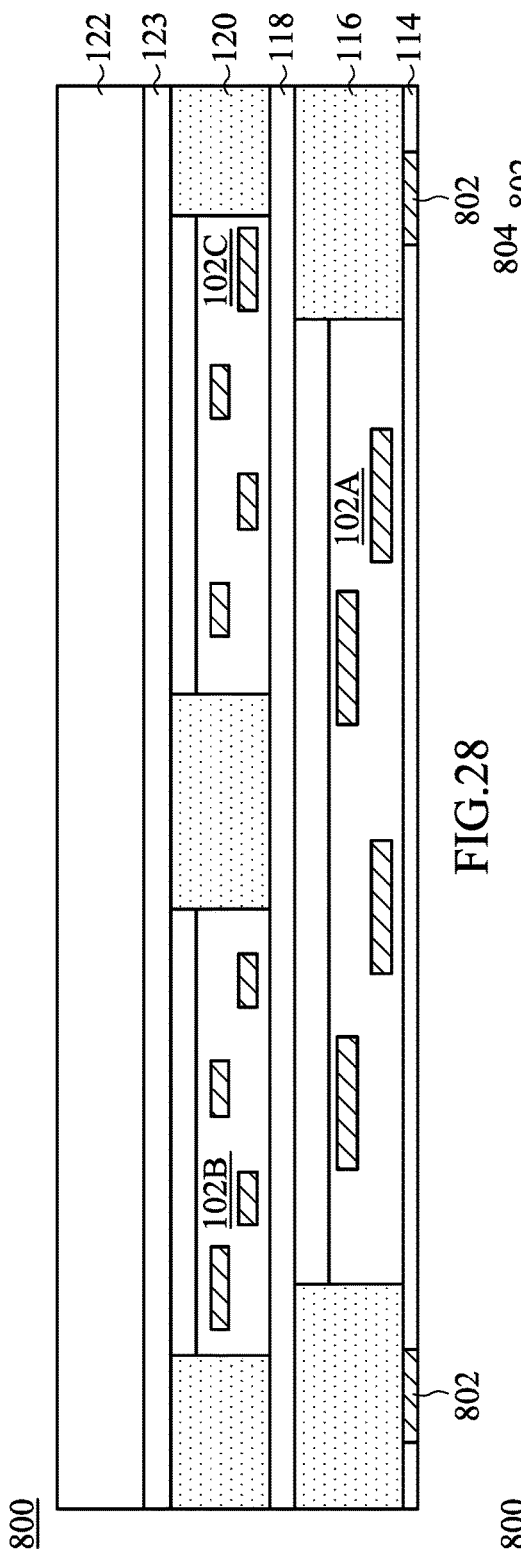
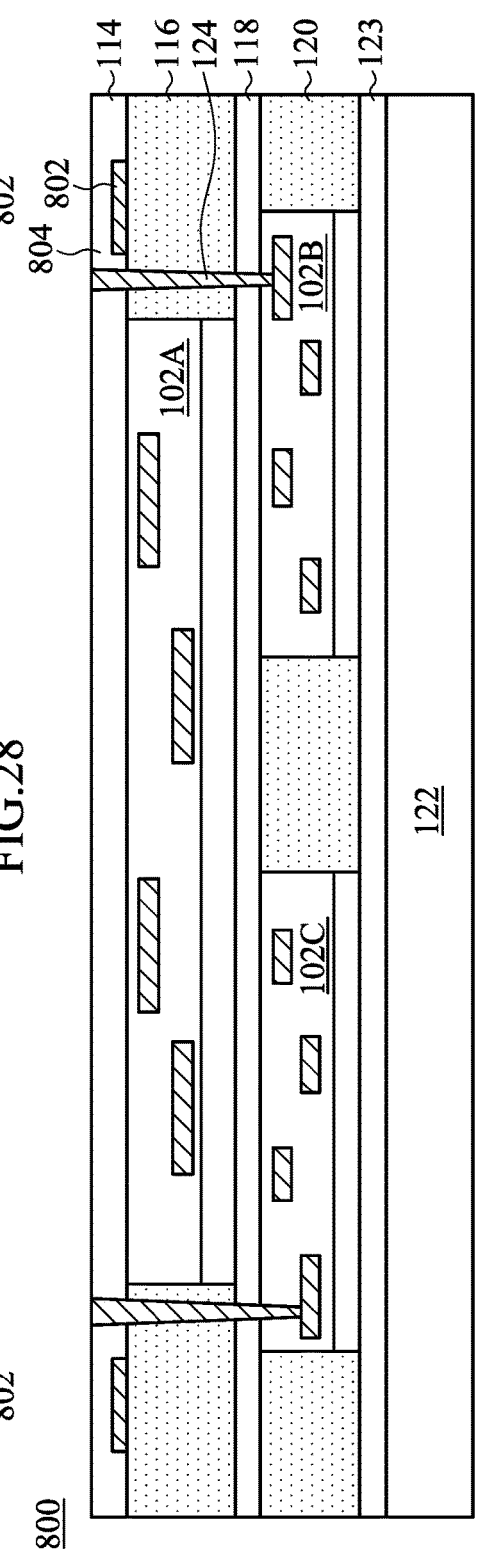

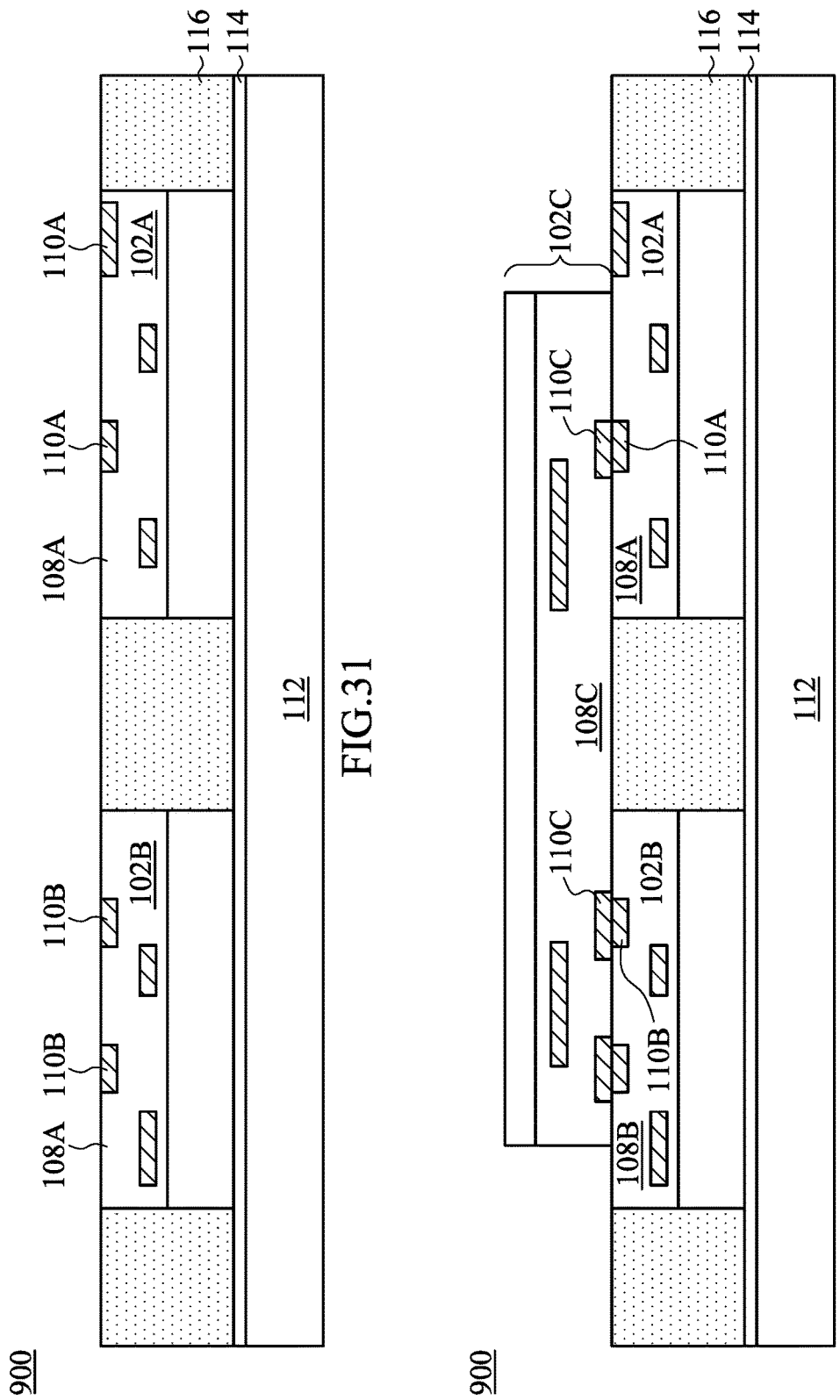

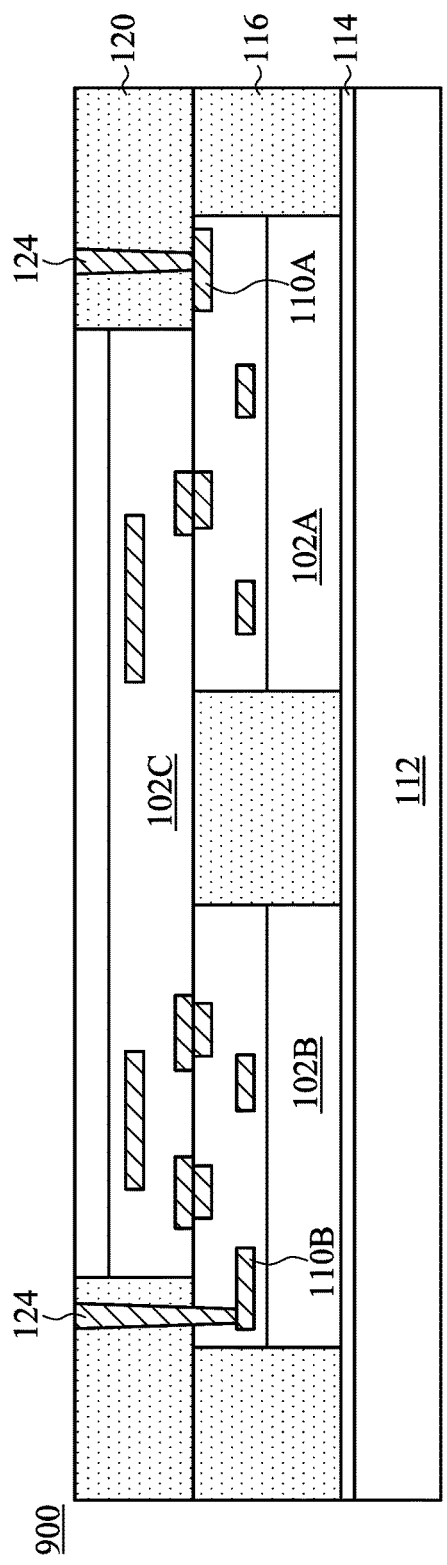
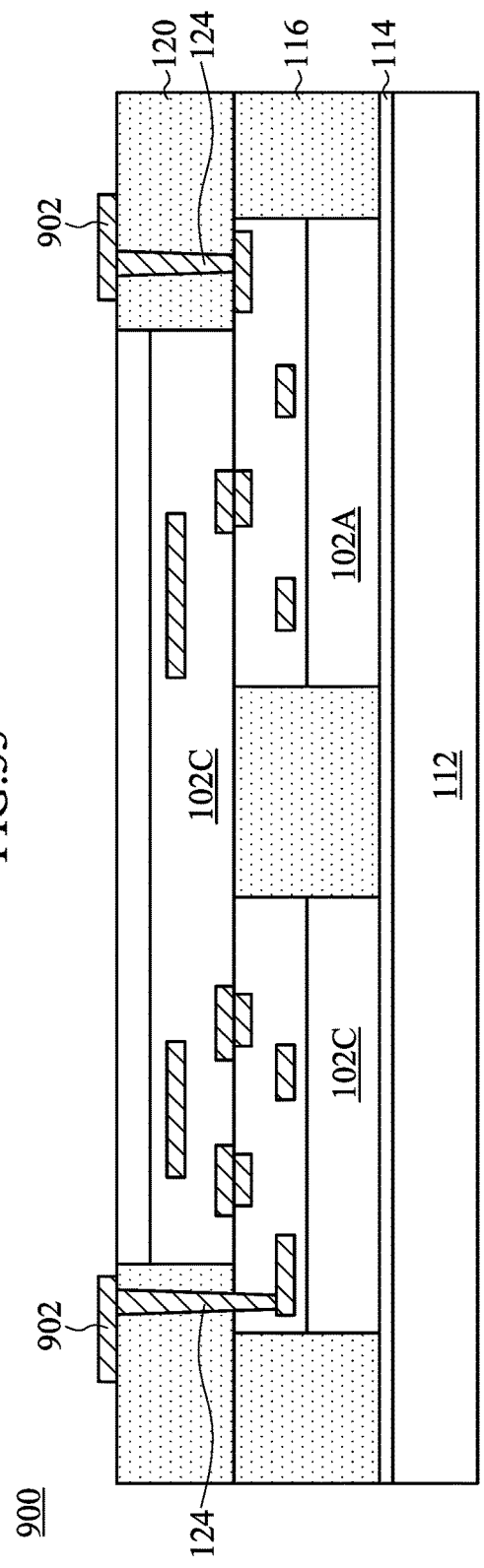
FIG.33
FIG.34

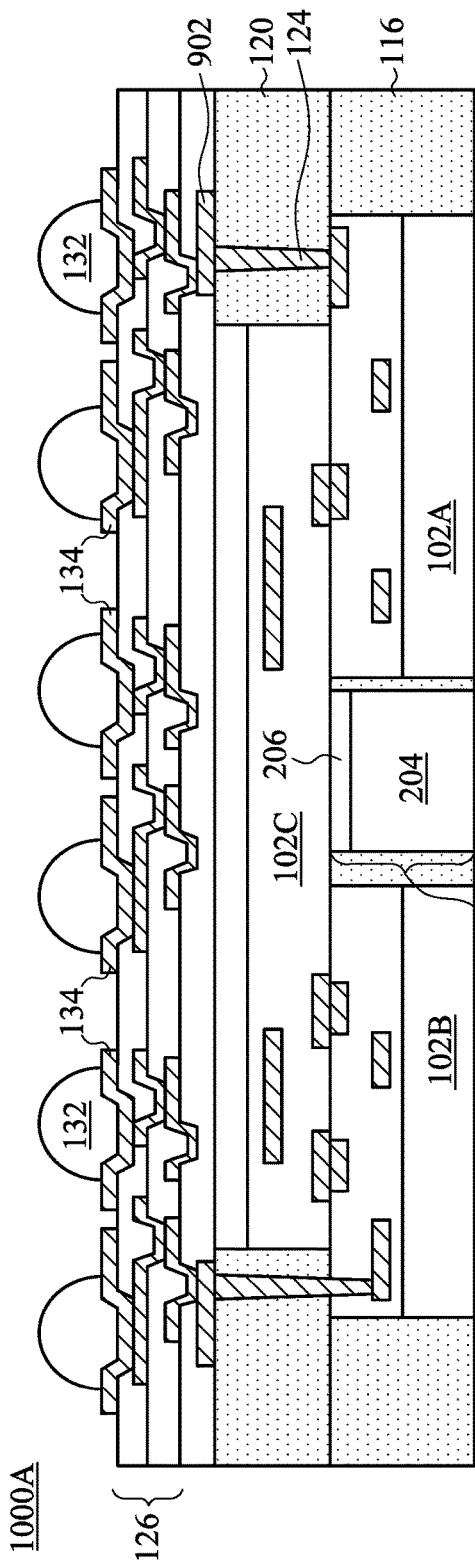
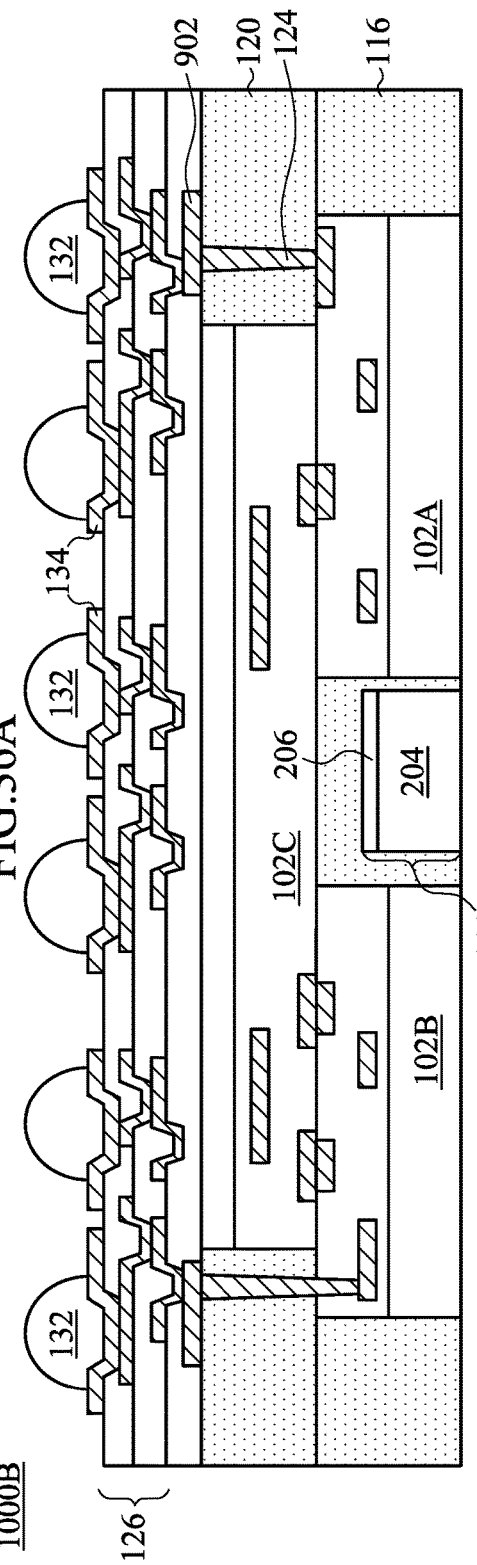
FIG. 36A
FIG. 36B

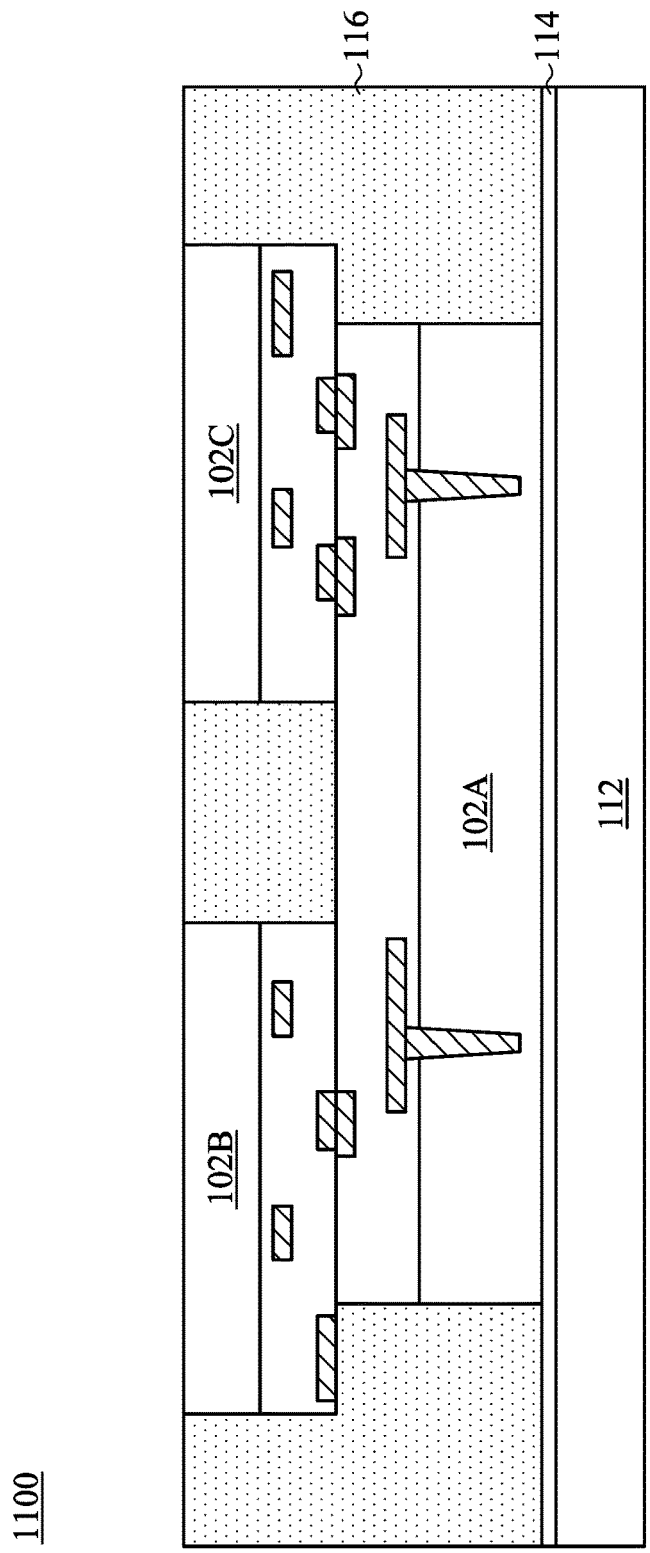

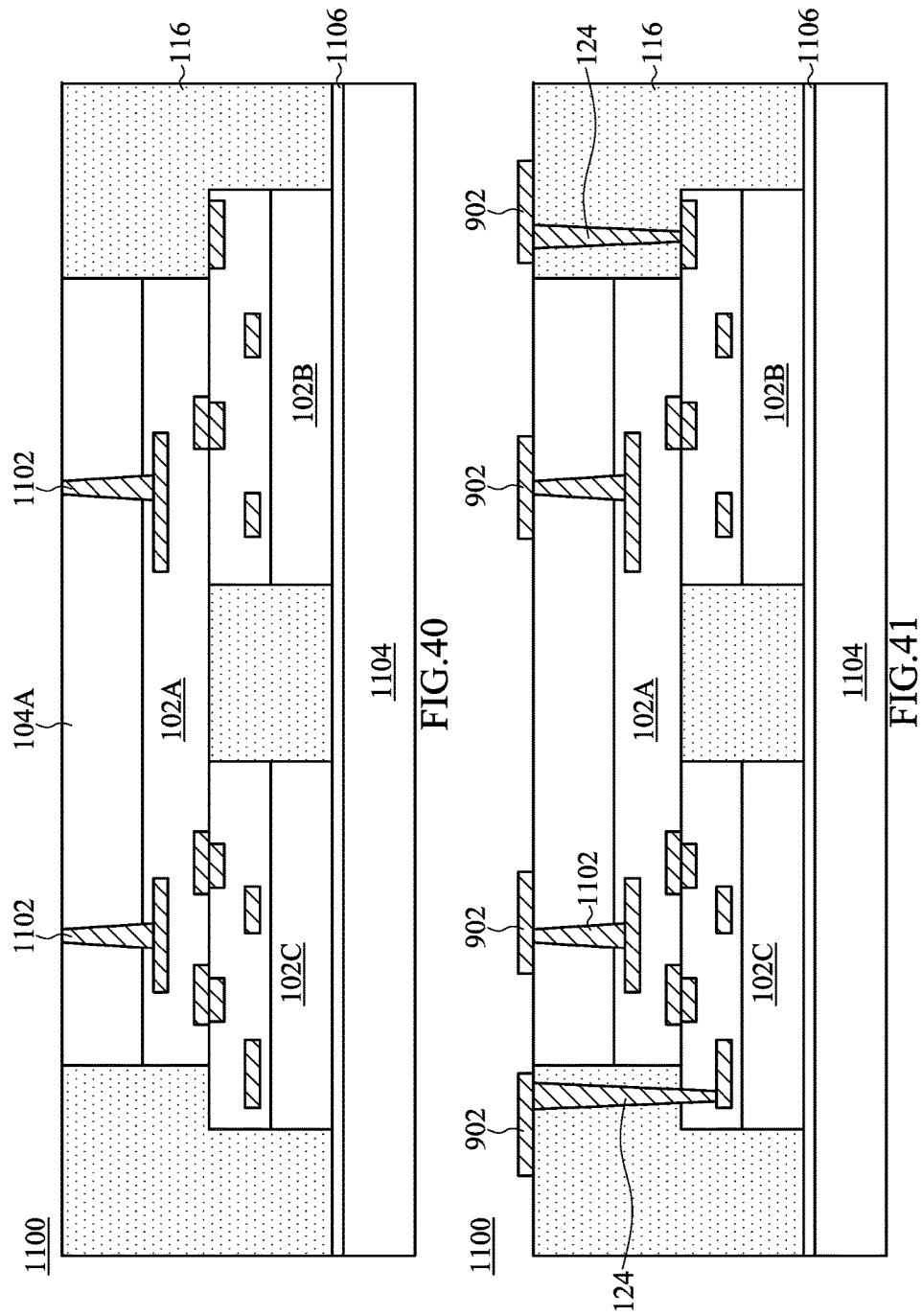

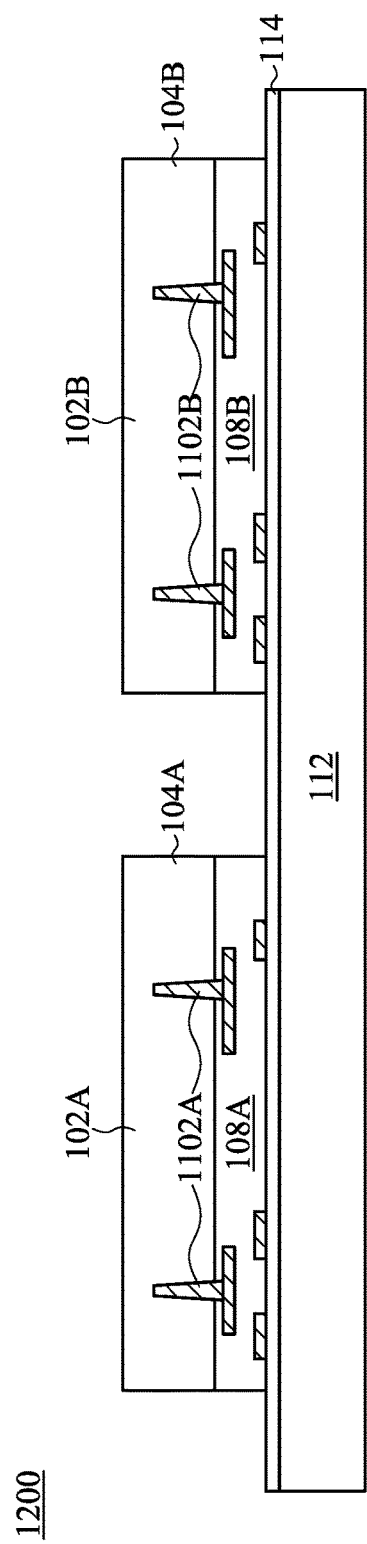
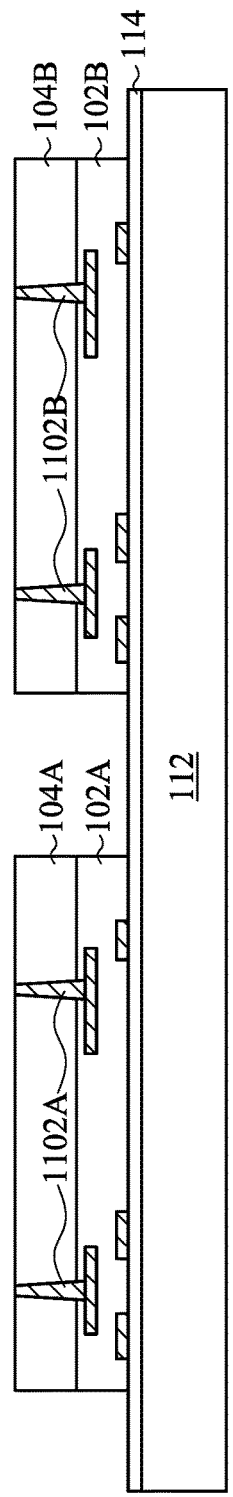
FIG. 43
FIG. 44

SYSTEM ON INTEGRATED CHIPS AND METHODS OF FORMING SAME

PRIORITY

This application is a continuation of U.S. application Ser. No. 14/960,225, filed on Dec. 4, 2015, entitled "System on Integrated Chips and Methods of Forming Same," which claims the benefit of U.S. Provisional Application No. 62/250,963, filed on Nov. 4, 2015 entitled "System on Integrated Chips and Methods of Forming Same," which applications are hereby incorporated herein by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed and greater bandwidth, as well as lower power consumption and latency has grown recently, there has grown a need for smaller and more creative packaging techniques of semiconductor dies.

As semiconductor technologies further advance, stacked semiconductor devices, e.g., 3D integrated circuits (3DIC), have emerged as an effective alternative to further reduce the physical size of a semiconductor device. In a stacked semiconductor device, active circuits such as logic, memory, processor circuits and the like are fabricated on different semiconductor wafers. Two or more semiconductor wafers may be installed on top of one another to further reduce the form factor of the semiconductor device.

Two semiconductor wafers or dies may be bonded together through suitable bonding techniques. The commonly used bonding techniques include direct bonding, chemically activated bonding, plasma activated bonding, anodic bonding, eutectic bonding, glass frit bonding, adhesive bonding, thermo-compressive bonding, reactive bonding and/or the like. An electrical connection may be provided between the stacked semiconductor wafers. The stacked semiconductor devices may provide a higher density with smaller form factors and allow for increased performance and lower power consumption.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 9 and 10A through 10C illustrate cross-sectional views various intermediary stages of forming a semiconductor package in accordance with some embodiments.

FIGS. 11A and 11B illustrate cross-sectional views of semiconductor packages having dummy dies in accordance with some embodiments.

FIGS. 14 through 19 illustrate cross-sectional views various intermediary stages of forming a semiconductor package in accordance with some other embodiments.

FIGS. 20 through 24 illustrate cross-sectional views various intermediary stages of forming a semiconductor package in accordance with some other embodiments.

FIGS. 25A and 25B illustrate cross-sectional views of semiconductor packages having dummy dies in accordance with some embodiments.

FIGS. 26 through 30 illustrate cross-sectional views various intermediary stages of forming a semiconductor package in accordance with some other embodiments.

FIGS. 31 through 35 illustrate cross-sectional views various intermediary stages of forming a semiconductor package in accordance with some other embodiments.

FIGS. 36A and 36B illustrate cross-sectional views of semiconductor packages having dummy dies in accordance with some embodiments.

FIGS. 37 through 42 illustrate cross-sectional views various intermediary stages of forming a semiconductor package in accordance with some other embodiments.

FIGS. 43 through 50 illustrate cross-sectional views various intermediary stages of forming a semiconductor package in accordance with some other embodiments.

DETAILED DESCRIPTION

Figure 3:
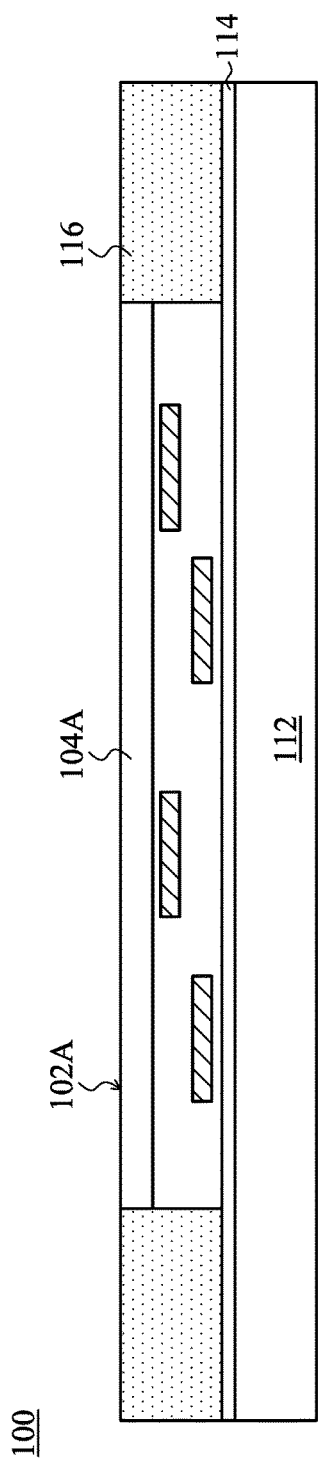

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments include methods and corresponding structures for forming a semiconductor device package. Various embodiments integrate multiple functional chips in a single device package and implements Chip-to-Wafer (e.g., known good die) for Chip-on-Wafer (CoW) level packaging. Functional chips may be directly bonded to other functional chips using bonding layers (e.g., by fusion bonding and/or hybrid bonding) in order to reduce the need to form solder bumps (e.g., microbumps) and underfill. Various embodiments may further advantageously provide a system-in-package (SiP) solution with smaller form factor, increased input/output density, and low via aspect ratio. Thus, manufacturing errors and costs can be reduced.

FIGS. 1 through 10A illustrate various cross-sectional views of intermediary stages of forming a semiconductor package 100 in accordance with an embodiment. Referring first to FIG. 1, a cross-sectional view of a device die 102A is provided. Die 102A may be a known good die (KGD), for example, which may have passed various electrical and/or structural tests. Die 102A may be a semiconductor die and could be any type of integrated circuit, such as an application processor, logic circuitry, memory, analog circuit, digital circuit, mixed signal, and the like. Die 102A may include a substrate 104A and an interconnect structure 106A over substrate 104A. Substrate 104A may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, such as a silicon or glass substrate. Alternatively, the substrate may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

Active devices (not illustrated) such as transistors, capacitors, resistors, diodes, photo-diodes, fuses, and the like may be formed at the top surface of substrate 104A. Interconnect structure 106A may be formed over the active devices and a front side of substrate 104A. The term "face" or "front" surface or side is a term used herein implying the major surface of the device upon which active devices and interconnect layers are formed. Likewise, the "back" surface of a die is that major surface opposite to the face or front.

The interconnect structure may include inter-layer dielectric (ILD) and/or inter-metal dielectric (IMD) layers 108A containing conductive features 110A (e.g., conductive lines and vias comprising copper, aluminum, tungsten, combinations thereof, and the like) formed using any suitable method. The ILD and IMD layers 108A may include low-k dielectric materials having k values, for example, lower than about 4.0 or even 2.0 disposed between such conductive features. In some embodiments, the ILD and IMD layers 108A may be made of, for example, phosphosilicate glass (PSG), borophosphosilicate glass (BPSG), fluorosilicate glass (FSG), $SiO_xC_y$, Spin-On-Glass, Spin-On-Polymers, silicon carbon material, compounds thereof, composites thereof, combinations thereof, or the like, formed by any suitable method, such as spinning, chemical vapor deposition (CVD), and plasma-enhanced CVD (PECVD). Interconnect structure 106A electrically connects various active devices to form functional circuits within die 102A. The functions provided by such circuits may include logic structures, memory structures, processing structures, sensors, amplifiers, power distribution, input/output circuitry, or the like. One of ordinary skill in the art will appreciate that the above examples are provided for illustrative purposes only to further explain applications of various embodiments and are non-limiting. Other circuitry may be used as appropriate for a given application.

Additional features, such as input/output (I/O) contacts, passivation layers, conductive pillars, and/or under bump metallurgy (UBM) layers, may also be optionally formed over interconnect structure 106A. The various features of die 102A may be formed by any suitable method and are not described in further detail herein. Furthermore, the general features and configuration of die 102A described above are but one example embodiment, and die 102A may include any combination of any number of the above features as well as other features.

As further illustrated by FIG. 1, die 102A is attached to a carrier 112. Die 102A may be oriented on carrier 112 so that a backside of substrate 104A is exposed. Generally, carrier 112 provides temporary mechanical and structural support various features (e.g., die 102A) during subsequent processing steps. In this manner, damage to the device dies is reduced or prevented. Carrier 112 may comprise, for example, glass, ceramic, and the like. In an embodiment, release layer 114 is used to attach die 102A to carrier 112. In some embodiments, carrier 112 may be substantially free of any active devices and/or functional circuitry. Release layer 114 may be any suitable adhesive, such as an ultraviolet (UV) glue, or the like. In another embodiment, carrier 112 may comprise bulk silicon, and die 102A may be attached to carrier 112 by a dielectric release layer 114. Die 102A may have an initial thickness T1 of about 700 μm to about 800 μm, for example.

In FIG. 2, a thinning process is applied to die 102A in order to reduce an overall thickness of die 102A to a desired thickness T2. In some embodiments, thickness T2 may be less than about 100 μm or less than about 10 μm, for example. In other embodiments, thickness T2 may be different depending on device design. The thinning process may include applying a mechanical grinding process, a chemical mechanical polish (CMP), an etch back process, or the like to substrate 104A of die 102A.

Subsequently, in FIG. 3, an isolation material 116 is formed around die 102A. Isolation material 116 extends along sidewalls of die 102A, and in a top-down view (not shown), isolation material 116 may encircle die 102A. Isolation material 116 may comprise a molding compound, a polymer material, a dielectric material, combinations thereof, or the like. The exact material used for isolation material 116 may be selected based on the thickness T2 of die 102A (see FIG. 2). For example, a thinner die 102A may allow for a dielectric material to be used for isolation material 116, which may advantageously provide improved process control, lower manufacturing costs, and reduced co-efficient of thermal expansion (CTE) mismatch, which advantageously reduces warpage in the resulting package. As another example, a polymer material or even a molding compound may be used for a thicker die 102A in order to provide improved structural support.

In embodiments where isolation material 116 comprises a dielectric material, isolation material 116 comprises an oxide, nitride, combinations thereof, or the like. In such embodiments, the oxide or nitride insulating film may include a silicon nitride, silicon oxide, silicon oxynitride, or another dielectric material, and is formed by CVD, PECVD, or another process.

In embodiments where isolation material 116 comprises a molding compound or a polymer, isolation material 116 may be shaped or molded using for example, a mold (not shown), which may have a border or other feature for retaining isolation material 116 when applied. Such a mold may be used to pressure mold the isolation material 116 around the die 102A to force isolation material 116 into openings and recesses, eliminating air pockets or the like in isolation material 116. Subsequently, a curing process is performed to solidify isolation material 116. In such embodiments, isolation material 116 comprises an epoxy, a resin, a moldable polymer such as PBO, or another moldable material. For example, isolation material 116 is an epoxy or resin that is cured through a chemical reaction or by drying. In another embodiment, the isolation material 116 is an ultraviolet (UV) cured polymer. Other suitable processes, such as transfer molding, liquid encapsulent molding, and the like, may be used to form isolation material 116.

After isolation material 116 is formed around die 102A, isolation material 116 is reduced or planarized by, for example, grinding, CMP, etching, or another process. For example, where isolation material 116 is an insulating film such as an oxide or nitride, a dry etch or CMP is used to reduce or planarize the top surface of the isolation material 116. In some embodiments, isolation material 116 is reduced so that die 102A is exposed, resulting in a backside surface of substrate 104A that is substantially planar with a top surface if isolation material 116.

Figure 4:
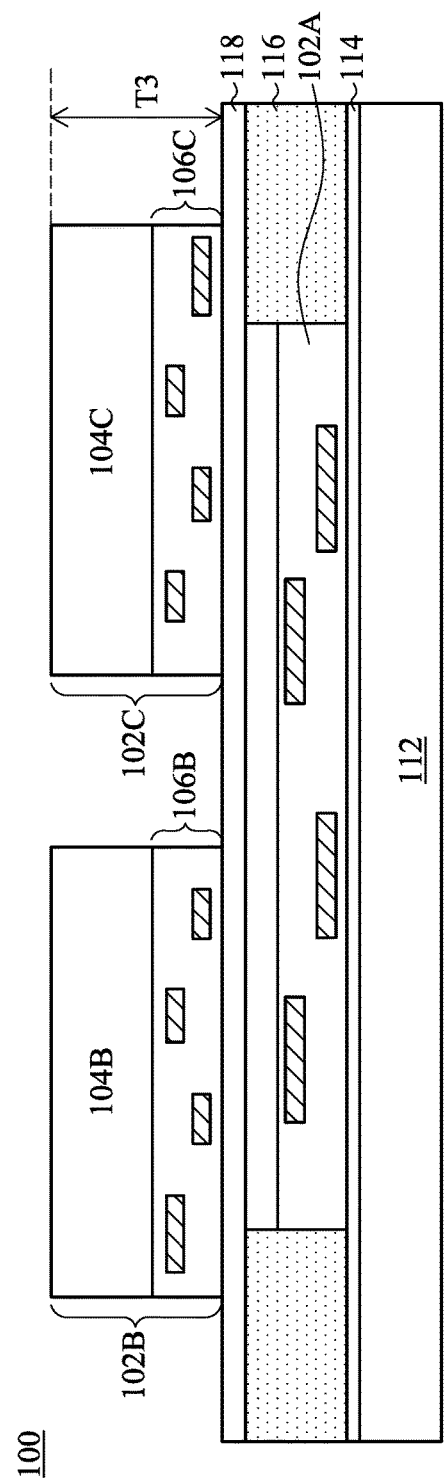

FIG. 4 illustrates the formation of a bonding layer 118 over die 102A and isolation material 116. Bonding layer 118 may comprise a dielectric material, such as silicon oxide although another suitable material may be used as well. Bonding layer 118 may be formed by chemical vapor deposition (CVD), plasma enhanced CVD (PECVD), combinations thereof, or the like.

After bonding layer 118 is formed, additional dies (e.g., dies 102B and 102C) may be bonded to die 102A. Bonding dies 102B and 102C may include a fusion bonding process where a dielectric layer of dies 102B/102C is directly bonded to bonding layer 118 to form a dielectric-to-dielectric bond. Thus, the need for solder joints (or other external connectors) for bonding dies in embodiment packages is reduced, which reduces manufacturing defects and cost. Dies 102B and 102C may be substantially similar to die 102A. For example, dies 102B and 102C may each comprise a semiconductor substrate 104B/104C, active devices (not shown) formed at a top surface of substrates 104B/104C, and interconnect structures 106B/106C formed over substrates 104B/104C. Interconnect structures 106B/106C electrically connect the active devices to for functional circuits, which may provide a same or different function as the circuitry in die 102A. For example, die 102A may include logic circuitry while dies 102B and 102C may include memory circuitry. Dies 102B and 102C may have a thickness T3 of about 700 µm to about 800 µm. Although FIG. 4 illustrates dies 102B and 102C having a same thickness, in other embodiments, dies 102B and 102C may have different thicknesses. Furthermore, dies 102B and 102C may occupy a same or different footprint compared to die 102A. For example, in the illustrated embodiment, portions of dies 102B and/or 102C extend laterally past sidewalls of die 102A and may be disposed directly over isolation material 116.

In FIG. 5, dies 102B and 102C may be thinned to a desired thickness T4. In some embodiments, thickness T4 may be less than about 100 µm or less, such as, about 50 µm or 10 µm, for example. Thicknesses of dies 102A, 102B, and 102C may or may not be the same. The thinning process may include applying a mechanical grinding process, CMP, an etch back process, or the like.

Next, in FIG. 6, an isolation material 120 is formed around dies 102B and 102C. Isolation material 120 extends along sidewalls of dies 102B and 102C, and in a top down view (not shown), isolation material may encircle both dies 102B and 102C. In various embodiments, isolation material 120 may be similar to isolation material 116 as described above. For example, isolation material 120 may comprise a dielectric material (e.g., an oxide, a nitride, or the like), a polymer, a molding compound, or the like, which may be selected based on the thickness T4 of dies 102B and 102C. Furthermore, isolation material 120 may comprise a same or different material as isolation material 116. After isolation material 120 is deposited, a planarization process (e.g., CMP, etch back, grinding, or the like) may be applied so that top surfaces of isolation material 120, die 102B, and die 102C may be substantially level. In another embodiment, isolation material 120 may remain disposed over dies 102B and 102C even after planarization (see e.g., FIG. 10C).

Figure 7:
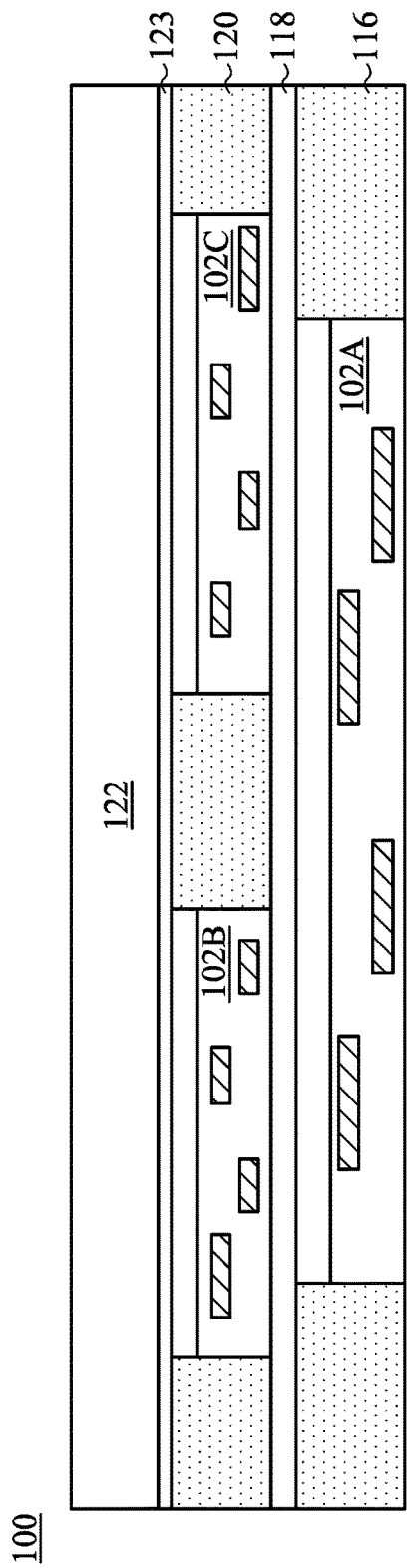

After isolation material 120 is formed, a second carrier 122 may be attached to a top surface of die 102B, die 102C, and isolation material 120 by a release layer 123. Carrier 122 and release layer 123 may be substantially similar to carrier 110 and release layer 112 as described above. For example, carrier 122 may comprise glass, ceramic, bulk silicon, or the like while release layer 123 comprises a DAF, a dielectric material, or the like. After carrier 122 is attached, the first carrier 110 may be removed from surfaces of die 102A and isolation material 116. Removing the carrier 110 may include applying UV radiation to release layer 114, a mechanical grinding process, an etch back process, combinations thereof, or the like. The resulting structure is illustrated in FIG. 7.

Figure 8:
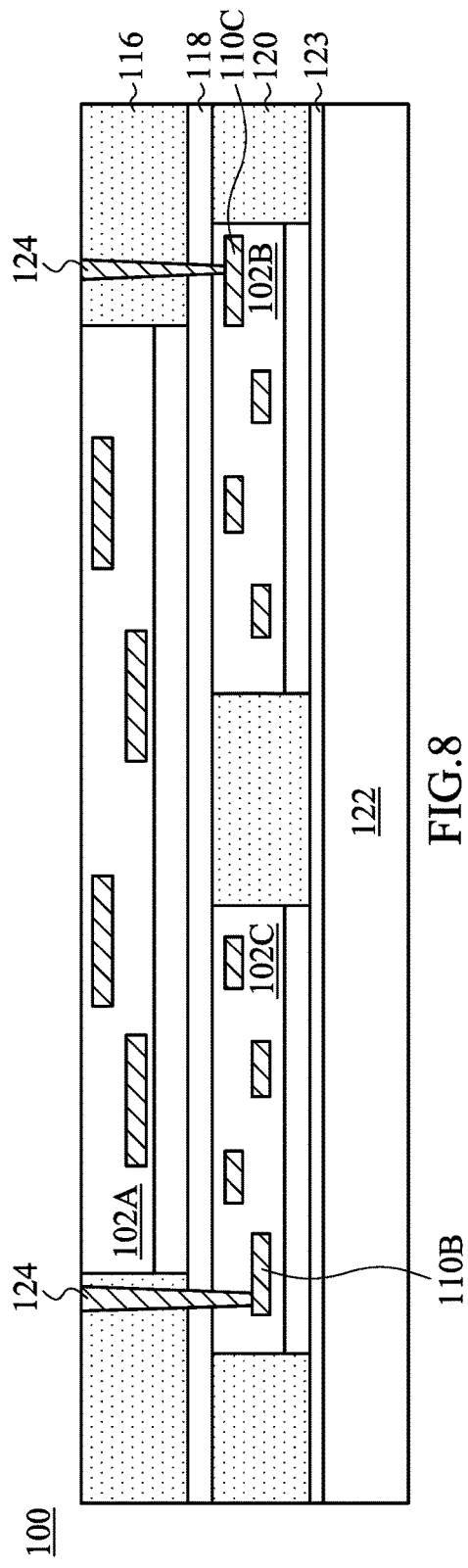

Referring to FIG. 8, an orientation of package 100 is flipped (e.g., so that carrier 122 is disposed below dies 102B and 102C), and through-vias 124 (sometimes referred to as through-dielectric vias (TDVs)) are formed in package 100. Flipping package 100 may further expose a front side of die 102A. Through-vias 124 may extend through isolation material 116 and bonding layer 118 to electrically connect to conductive features 110B in die 102B and/or conductive features 110C in die 102C. Forming through-vias 124 may include a damascene process. For example, openings may be patterned in various layers in package 100 using a combination of photolithography and/or etching. The openings may expose various conductive features 110B and/or 110C. A conductive material may be deposited in the opening's (e.g., using electroless plating, electrochemical plating, or the like). In some embodiments, the conductive material may overfill the openings, and a planarization process (e.g., CMP) may be applied to remove excess conductive material and form through-vias 124.

Figure 9:
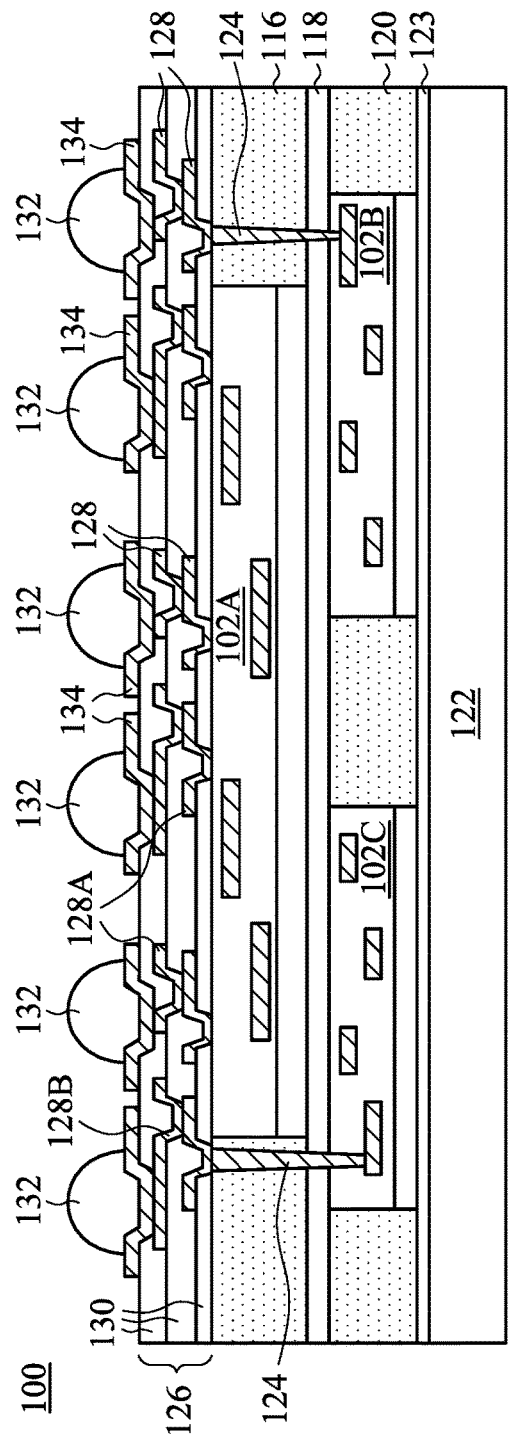

In FIG. 9, fan-out redistribution layers (RDLs) 126 may be formed over isolation material 116 and die 102A. RDLs 126 may extend laterally past edges of die 102A over a top surface of isolation material 116. RDLs 126 may include conductive features 128 formed in one or more polymer layers 130. Polymer layers 130 may be formed of any suitable material (e.g., polyimide (PI), polybenzoxazole (PBO), benzocyclobuten (BCB), epoxy, silicone, acrylates, nano-filled pheno resin, siloxane, a fluorinated polymer, polynorbornene, and the like) using any suitable method, such as, a spin-on coating technique, lamination, and the like.

Conductive features 128 (e.g., conductive lines 128A and/or vias 128B) may be formed in polymer layers 130 and electrically connect to dies 102B/102C (e.g., by through-vias 124) as well as interconnect structure 106A of die 102A.

The formation of conductive features 128 may include patterning polymer layers 130 (e.g., using a combination of photolithography and/or etching processes) and forming conductive features over and in the patterned polymer layer. For example, conductive features 128 may further include depositing a seed layer (not shown), using a mask layer (not shown) having various openings to define the shape of conductive features 128, and filling the openings in the mask layer using an electro-chemical plating process, for example. The mask layer and excess portions of the seed layer may then be removed. The number of polymer layers and conductive features of RDLs 126 is not limited to the illustrated embodiment of FIG. 9. For example, RDLs 126 may include any number of stacked, electrically connected conductive features in multiple polymer layers.

As further illustrated by FIG. 9, additional I/O features are formed over RDLs 126. For example, external connectors 132 (e.g., BGA balls, C4 bumps, and the like) may be formed over RDLs 126. Connectors 132 may be disposed on UBMs 134, which may also be formed over RDLs 126. Connectors 132 may be electrically connected to dies 102A, 102B, and 102C by RDLs 126. Connectors 132 may be used to electrically connect package 100 to other package components such as another device die, interposers, package substrates, printed circuit boards, a mother board, and the like.

Figure 10A:
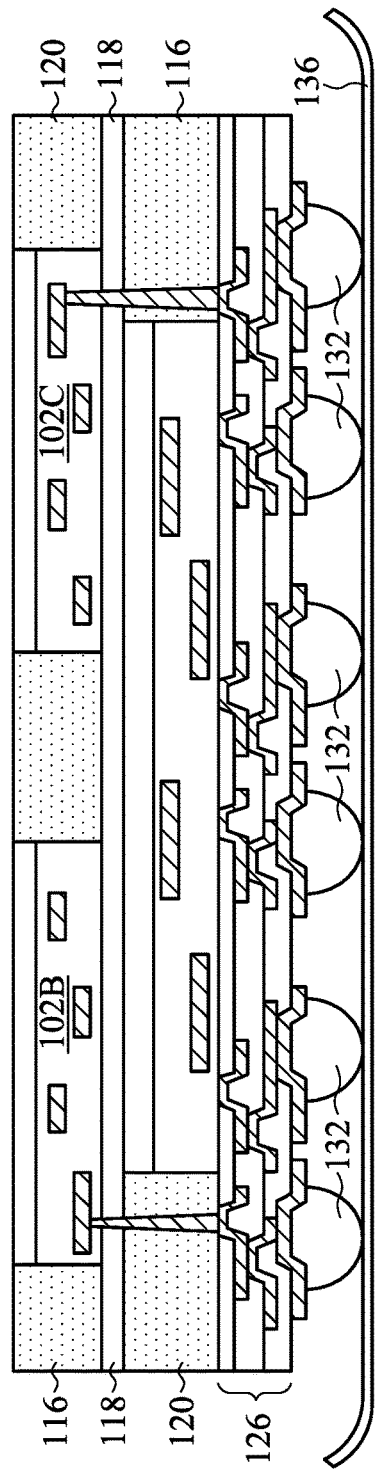
Figure 10B:
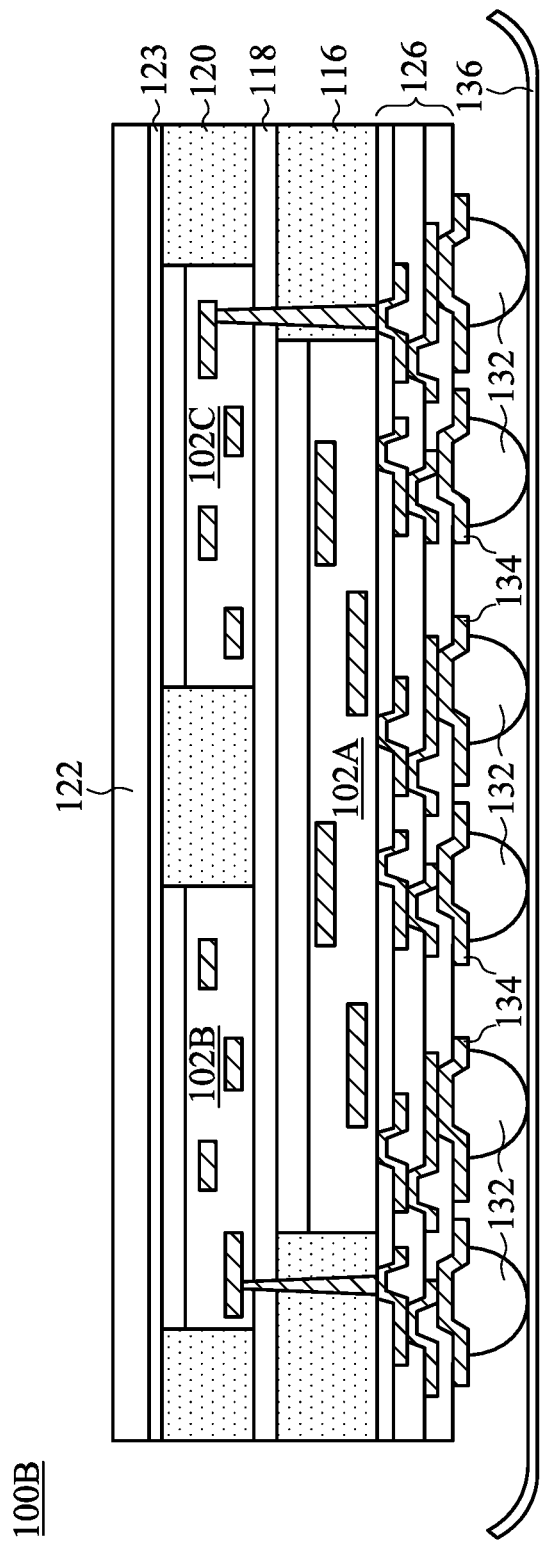
Figure 10C:
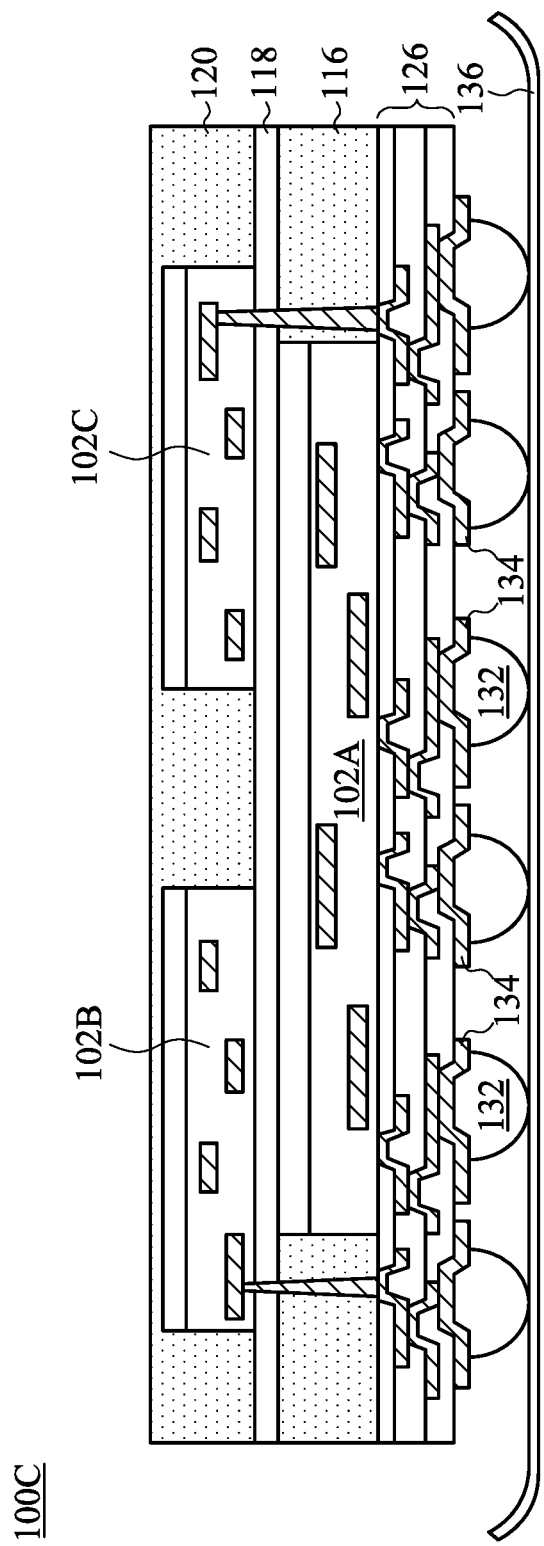

Subsequently, carrier 122 may be removed as illustrated in FIG. 10A. As further illustrated in FIG. 10A, an orientation of package 100 may be reversed to expose carrier 122 (see FIG. 9). In the reversed orientation, connectors 132 may be attached to a temporary support frame 136 (e.g., comprising a support tape) while carrier 122 is removed. Carrier 122 may be removed using any suitable process. For example, when release layer 123 comprises a UV glue, release layer 123 may be exposed to a UV source to remove carrier 122. In another embodiment, an etch back, grinding, or other process may be used to remove carrier 122. In other embodiments (e.g., as illustrated by FIG. 10B), carrier 122 may thinned without being completely removed. For example, carrier 122 may comprise silicon, and a reduced carrier 122 may remain in the resulting package 100B. In such embodiments, remaining portions of carrier 122 be used as a heat dissipation feature in package 100B. Furthermore, in package 100, surfaces of dies 102B and 102C are exposed. In other embodiments (e.g., as illustrated by FIG. 10C), dies 102B and 102C may be fully covered by isolation material 120, and isolation material 120 may be disposed on a back surface of dies 102B and 102C in package 100C.

FIGS. 11A and 11B illustrate cross-sectional views of packages 200A and 200B according to some embodiments. Packages 200A and 200B may be similar to package 100 where like reference numerals indicate like elements. Packages 200A and 200B include dummy dies 202 adjacent one or more functional device dies (e.g., dies 102B and 102C). In the embodiment package 200A illustrated by FIG. 11A, dummy die 202 has a same thickness as dies 102B/102C. In the embodiment package 200B illustrated by FIG. 11B, dummy die 202 has a different thickness than dies 102B/102C. Compared to functional dies 102A/102B/102C, which comprise functional circuitry, dummy dies 202 may be substantially free of any active devices, functional circuits, or the like. For example, dummy dies 202 may include a substrate 204 (e.g., a bulk silicon substrate) and a dielectric, bonding layer 206. Bonding layer 206 may be used to bond dummy dies 202 to bonding layer 118 using a fusion bonding process, for example. In some embodiments, dummy dies 202 are included for improved uniformity in a device layer, which may result in improved planarization. Dummy dies 202 may also be included to reduce CTE mismatch amongst various features in packages 200A and 200B.

Figure 12:
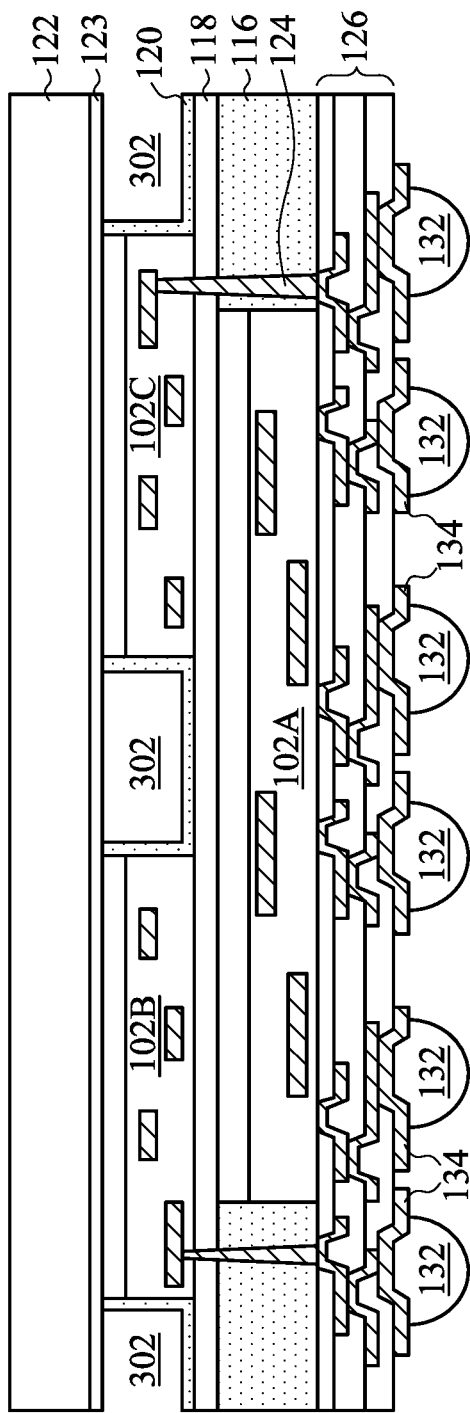
FIG. 12 illustrates a cross-sectional view of a semiconductor package having a conformal isolation material in accordance with some embodiments.

FIG. 12 illustrates a cross-sectional view of a package 300 according to some embodiments. Package 300 may be similar to package 100 where like reference numerals indicate like elements. In package 300, isolation material 120 comprises a dielectric material (e.g., an oxide, nitride, or the like), and isolation material 120 may be deposited as a conformal layer using a suitable process (e.g., CVD, PECVD, and the like). For example, a portion of isolation material 120 on a top surface of bonding layer 118 may have a substantially same thickness as a portion of isolation material 120 on sidewalls of dies 102B/102C. After isolation material 120 is deposited, a planarization process may be applied to expose dies 102B/102C. Subsequently, carrier 122 is attached to dies 102B/102C by release layer 123 (e.g., a dielectric layer). Because isolation material 120 is a conformal layer, cavities 302 (e.g., comprising air) may be formed between carrier 122 and isolation material 120. In package 300, at least a portion of carrier 122 may remain in the completed package as a heat dissipation feature. In other embodiments, carrier 122 may be removed and omitted from the completed package.

Figure 13:
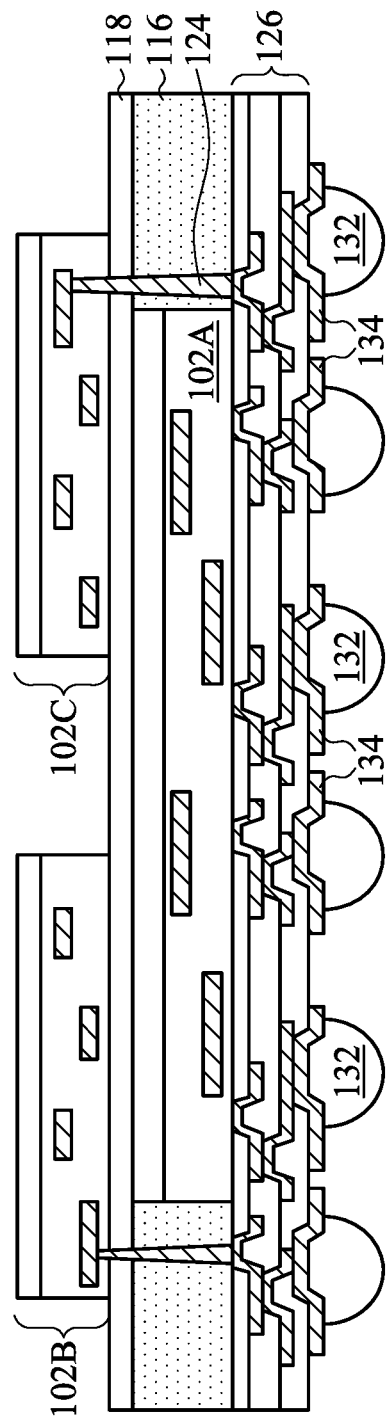
FIG. 13 illustrates a cross-sectional view of a semiconductor package having exposed dies in accordance with some other embodiments.

FIG. 13 illustrates a cross-sectional view of a package 400 according to some embodiments. Package 400 may be similar to package 100 where like reference numerals indicate like elements. In package 400, isolation material 120 (see e.g., FIG. 10A) may be omitted. For example, sidewalls and back surfaces of dies 102B and 102C may be exposed in the completed package 400. In another embodiment, additional features (e.g., heat dissipation features) may be formed on directly a back surface and/or sidewalls of dies 102B and 102C.

FIGS. 14 through 19 illustrate cross-sectional views of intermediary stages of forming a semiconductor package 500 in accordance with an embodiment. Package 500 in FIG. 14 may be substantially similar to package 100 in FIG. 5 where like reference numerals indicate like elements. For example, dies 102B and 102C may be directly bonded (e.g., fusion bonded) to a bottom fan-out structure (die 102A and isolation material 116) by a bonding layer 118. The various intermediary steps of forming package 500 in FIG. 14 may be substantially similar to the process described above with respect to FIGS. 1 through 5, and additional description is omitted herein for brevity.

Referring next to FIG. 15, an isolation material 120 is formed on a backside and along sidewalls of dies 102B and 102C. Isolation material 120 may further be deposited as a conformal layer using a suitable process (e.g., CVD, PECVD, and the like). For example, a portion of isolation material 120 on a top surface of bonding layer 118 may have a substantially same thickness as a portion of isolation material 120 on sidewalls of dies 102B/102C. In some embodiments, a thickness of isolation material 120 in package 500 may be about 1 µm to about 2 µm. In some embodiments, isolation material 120 may be included to reduce CTE mismatch between different fan-out portions (e.g., portions of package 500 opposing bonding layer 118).

Figure 16:
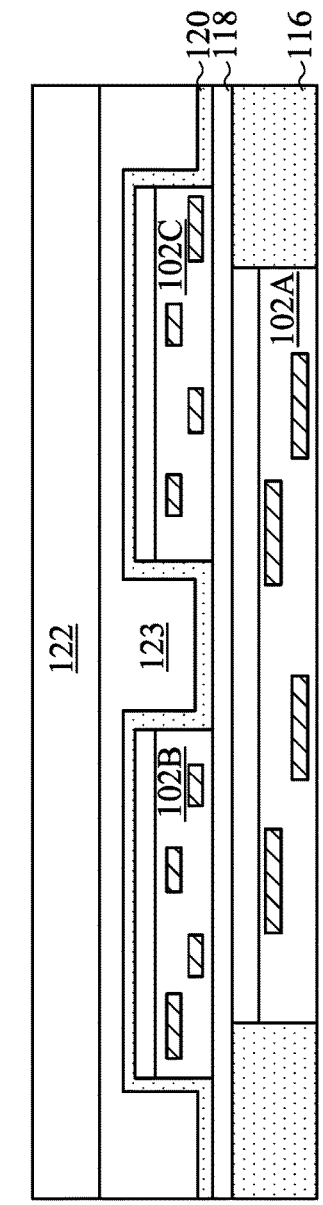

After isolation material 120 is formed, a carrier 122 may be attached to a top surface isolation material 120 by a release layer 123 as illustrated by FIG. 16. In an embodiment, carrier 122 may comprise glass, ceramic, bulk silicon, or the like while release layer 123 comprises a DAF, a dielectric material, or the like. Release layer 123 may be blanket deposited to fill caps between dies 102B and 102C using, for example, a spin-on process. A surface of release layer 123 opposite isolation material 120 may be substantially level (e.g., planarized) to provide a suitable surface for carrier 122 to adhere to. In some embodiments, release layer may comprise a glue layer or other suitable material for filling gaps between dies 102B and 102C. After carrier 122 is attached, the first carrier 110 may be removed from surfaces of die 102A and isolation material 116.

Figure 17:
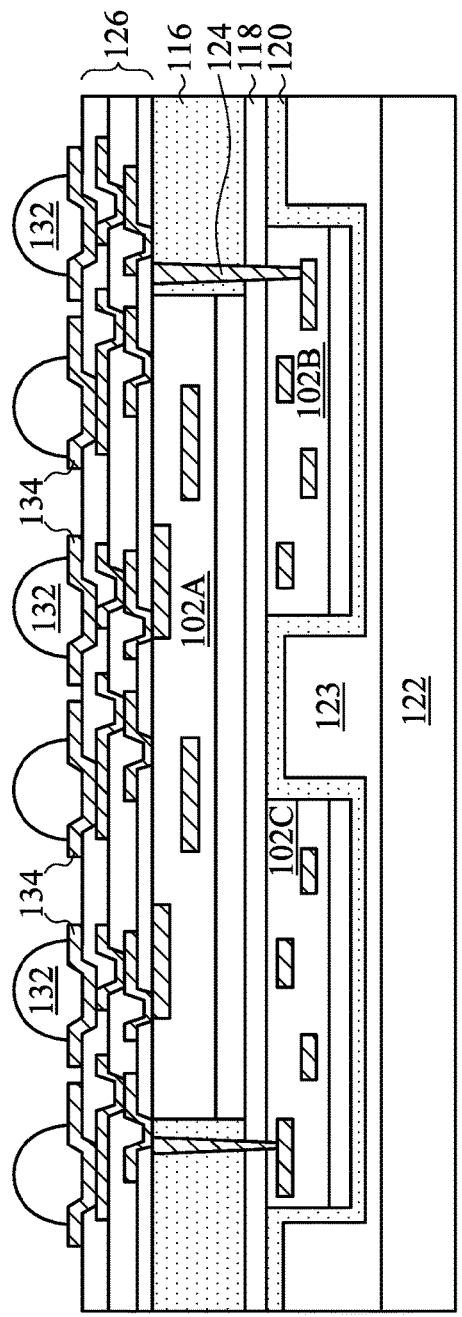

Next in FIG. 17, an orientation of package 500 is reversed so that package 500 is disposed over carrier 122 and release layer 123. After package 500 is flipped, various additional features, such as, through vias (TVs) 124, RDLs 126, UBMs 134, and connectors 132 are formed over dies 102A, 102B, and 102C as described above. In some embodiments, TVs 124 has a relatively low aspect ratio (e.g., a ratio of a height to a width of TV 124). For example, the aspect ratio of TVs 124 may be less than 5, which advantageously reduce manufacturing defects (e.g., gaps). RDLs 126 may extend past edges of die 102A onto a top surface of isolation material 116. RDLs 126 may be electrically connected to die 102A as well as dies 102B and 102C (e.g., by TVs 124). External connectors 132 are electrically connected to dies 102A, 102B, and 102C by RDLs 126.

Figure 18:
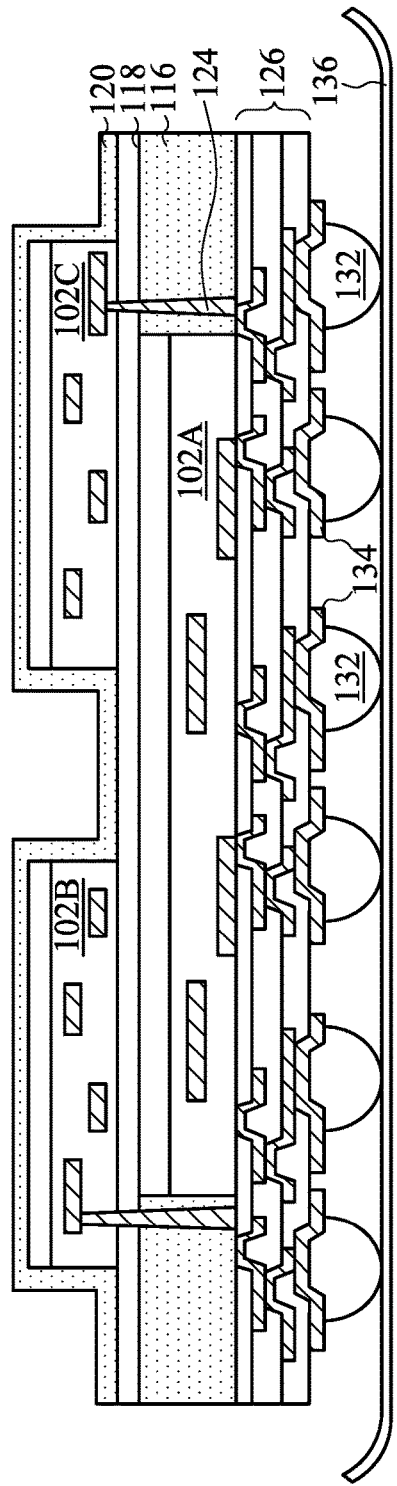

Subsequently, carrier 122 may be removed as illustrated in FIG. 18. As further illustrated in FIG. 18, an orientation of package 500 may be reversed to expose carrier 122 (see FIG. 17). In the reversed orientation, connectors 132 may be attached to a temporary support frame 136 (e.g., comprising a support tape) while carrier 122 is removed. Carrier 122 may be removed using any suitable process. For example, when release layer 123 comprises a UV glue, release layer 123 may be exposed to a UV source to remove carrier 122. After carrier 122 is removed, isolation material 120 is exposed.

Figure 19:
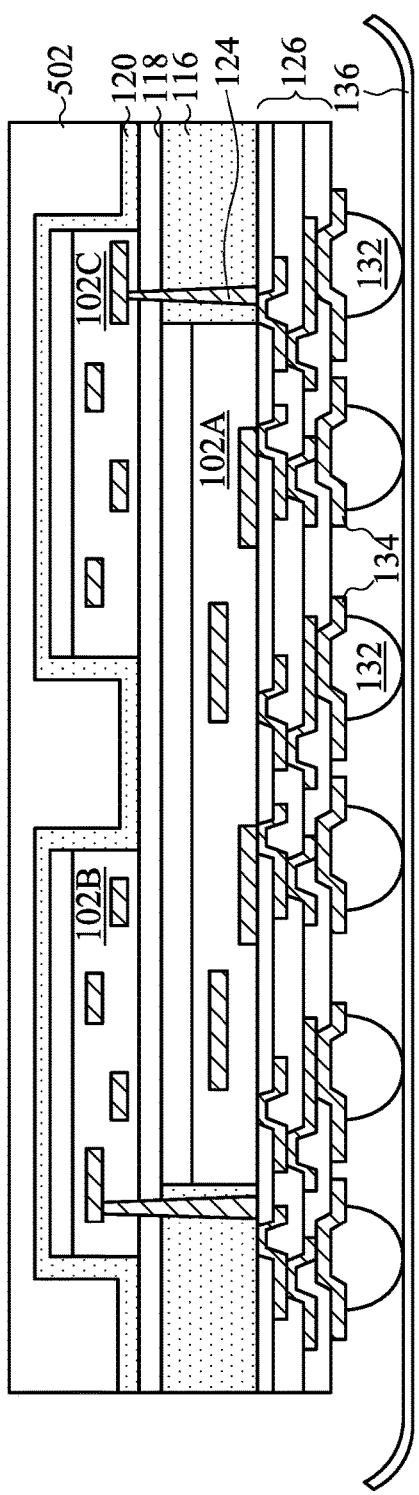

In FIG. 19, an additional isolation material 502, such as a molding compound or polymer, is formed over isolation material 120. Isolation material 502 may fill gaps between dies 102B and 102C. Isolation material 502 may be dispensed in liquid form and cured as described above. Furthermore, a planarization process (e.g., CMP, mechanical grinding, etch back, and the like) may be applied to a surface of isolation material 502 opposite isolation material 120. Isolation material 502 may be included to provide additional structural support to package 500, which allows isolation material 120 to be included even when dies 102B and 102C are relatively thick.

FIGS. 20 through 24 illustrate cross-sectional views of intermediary stages of forming a semiconductor package 600 in accordance with an embodiment. Package 600 in FIG. 20 may be substantially similar to package 100 after forming bonding layer 118 where like reference numerals indicate like elements. For example, a dielectric bonding layer 118 (e.g., an oxide layer) may be deposited over die 102A and isolation material 116. The various intermediary steps of forming package 600 in FIG. 20 may be substantially similar to the process described above with respect to FIGS. 1 through 4, and additional description is omitted herein for brevity.

In FIG. 21, conductive features 602 are formed in bonding layer 118. In some embodiments, conductive features 602 are formed using a damascene process where openings are etched into bonding layer 118, the openings are filled with a conductive material, and a planarization process is used to remove excess conductive material over bonding layer 118. In another embodiment, a seed layer (not shown) is deposited, a mask having openings therein is used to define a pattern of conductive features 602, and openings in the mask are filled with a conductive material (e.g., using an electroless plating process or the like). Subsequently, the mask and excess portions of the seed layer are removed, and a dielectric material may be formed around the resulting conductive features 602. The dielectric material may comprise a same material as bonding layer 118 and is also referred to as bonding layer 118 hereinafter.

Next in FIG. 22, dies 102B and 102C are bonded to bonding layer 118 using a hybrid bonding process, for example, to form conductor-to-conductor bonds as well as dielectric-to-dielectric bonds. Thus, the need for solder joints (or other external connectors) for bonding dies in embodiment packages is reduced, which reduces manufacturing defects and cost. Dies 102B and 102C may be substantially similar to die 102A. In a hybrid bonding process, conductive features 110B of die 102B and conductive features 110C of die 102C may be aligned and contacted to conductive features 602. ILD/IMD layers 108B and 108C of dies 102B and 102C, respectively, may also be contacted to bonding layer 118. Subsequently and anneal may be performed to directly bond the conductive and dielectric materials together. In package 600, conductive features 602 are electrically connected to dies 102B and 102C in order to provide additional electrical routing for increased circuit design flexibility. For example, conductive features 602 may be used to route electrical signals from dies 102B and 102C to another area of package 600, such as an area beyond edges of dies 102B and 102C. Thus, routing is not limited to the footprint of dies 102B and 102C, which provides increased package design flexibility. Conductive features 602 may or may not electrically connect die 102B to die 102C.

After dies 102B and 102C are bonded to bonding layer 118, an isolation material 120 is formed around dies 102B and 102C as described above. Isolation material 120 may comprise a dielectric material (e.g., an oxide, nitride, oxynitride, or the like), a molding compound, a polymer, or the like. The resulting structure is illustrated in FIG. 23. Although a non-conformal isolation material 120 is illustrated, in other embodiments, isolation material 120 may be a conformal layer.

Figure 24:
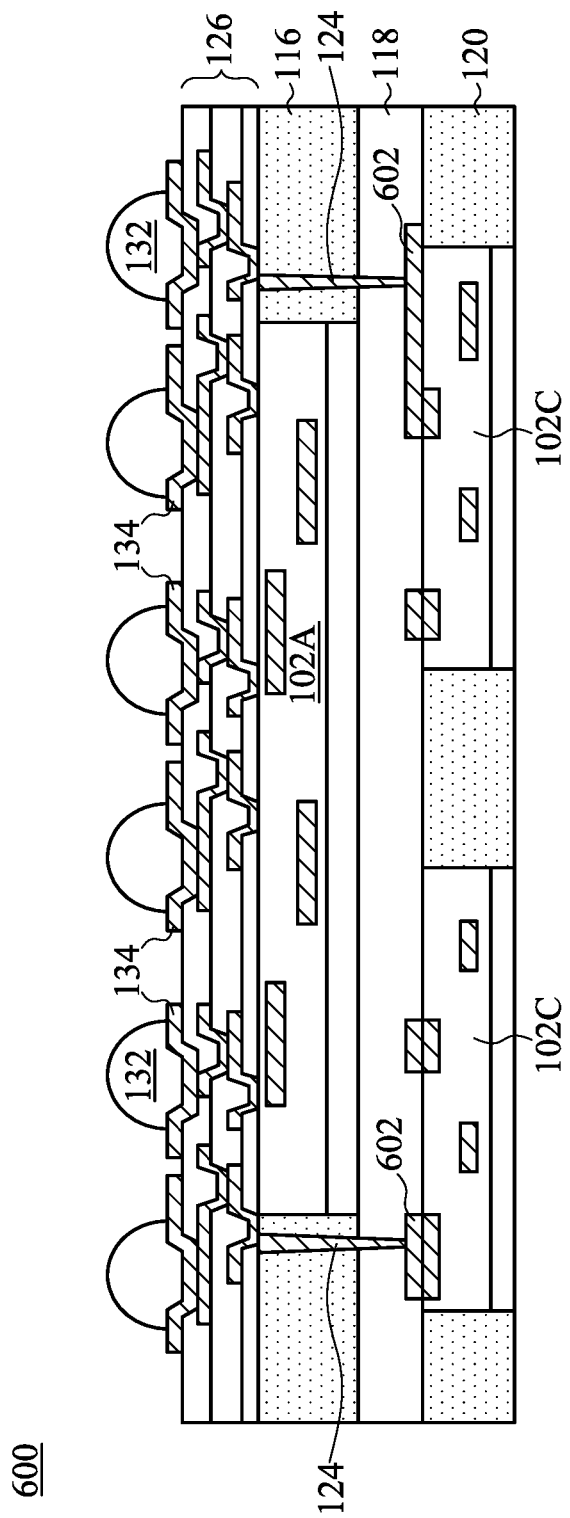
Figure 26:
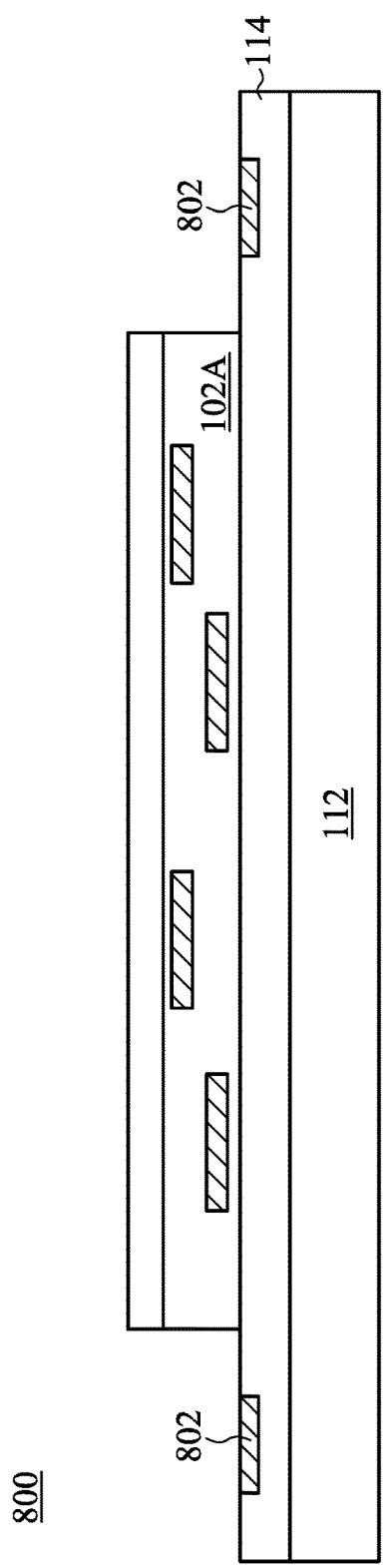

Subsequently, in FIG. 24, additional features are formed in package 600. For example, TVs 124, RDLs 126, UBMs 134, and connectors 132 over dies 102A, 102B, and 102C as described above. RDLs 126 may extend past edges of die 102A onto a top surface of isolation material 116. RDLs 126 may be electrically connected to die 102A as well as dies 102B and 102C (e.g., by TVs 124). TVs 124 may be formed to contact conductive features 602 in bonding layer 118. External connectors 132 are electrically connected to dies 102A, 102B, and 102C by RDLs 126.

FIGS. 25A and 25B illustrate cross-sectional views of packages 700A and 700B according to some embodiments. Packages 700A and 700B may be similar to package 600 where like reference numerals indicate like elements. Packages 700A and 700B include dummy dies 202 adjacent one or more functional device dies (e.g., dies 102B and 102C) as described above. In the embodiment package 700A illustrated by FIG. 25A, dummy die 202 has a same thickness as dies 102B/102C. In the embodiment package 700B illustrated by FIG. 25B, dummy die 202 has a different thickness than dies 102B/102C. Bonding layer 206 may be used to bond dummy dies 202 to bonding layer 118 using a fusion bonding process or hybrid bonding process, for example. In some embodiments, dummy dies 202 are included for improved uniformity in a device layer, which may result in improved planarization. Dummy dies 202 may also be included to reduce CTE mismatch amongst various features in packages 700A and 700B.

FIGS. 26 through 30 illustrate cross-sectional views of intermediary stages of forming a semiconductor package 800 in accordance with an embodiment. Package 800 in FIG. 26 may be substantially similar to package 100 in FIG. 2 where like reference numerals indicate like elements. For example, die 102 may be attached to a carrier 112 by a release film 114. Release film 114 may comprise a dielectric material (e.g., a buried oxide layer), and release film 114 may comprise alignment marks 802 for improved alignment control for forming various features of package 800. Alignment marks may be included for improved accuracy control during various chip (e.g., die) bonding processes.

Figure 27:
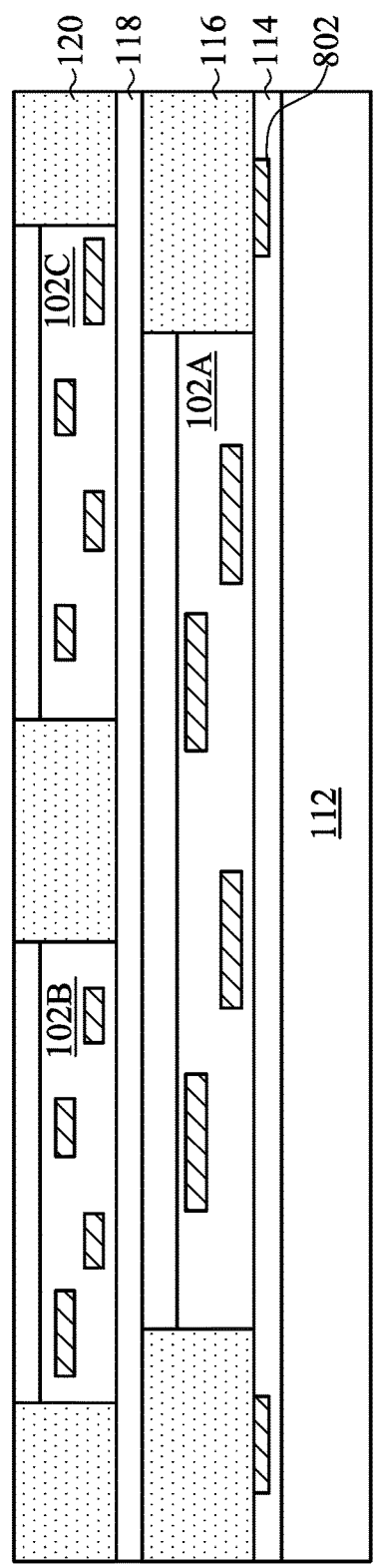

Referring next to FIG. 27, an isolation material 116 is formed around die 102A, and bonding layers 118 is formed over isolation material 116 and die 102A. Dies 102B and 102C are bonded to die 102, for example, using a fusion bonding process with bonding layer 118. An isolation material 120 is formed between dies 102B and 102C. Although a non-conformal isolation material 120 is illustrated, in other embodiments, isolation material 120 may be a conformal layer. The various process steps for forming isolation material 116, bonding layer 118, and isolation material 120 may be similar to the steps described above with respect to FIG. 6 and are not discussed further herein for brevity.

After isolation material 120 is formed, a carrier 122 may be attached to a top surface isolation material 120 by a release layer 123 as illustrated by FIG. 16. In an embodiment, carrier 122 may comprise glass, ceramic, bulk silicon, or the like while release layer 123 comprises a DAF, a dielectric material, or the like. After carrier 122 is attached, the first carrier 110 may be removed from surfaces of die 102A and isolation material 116. Removing carrier 110 may include a grinding process (or other suitable planarization process), which may further remove portions of release film 114 to expose alignment marks 802. The resulting structure is illustrated in FIG. 28.

Next in FIG. 29, an orientation of package 500 is reversed so that package 500 is disposed over carrier 122 and release layer 123. After package 500 is flipped, an additional dielectric material 804 is formed over release layer 114 and alignment marks 802. Subsequently, TVs 124 may be formed extending through dielectric material 804, release layer 114, isolation material 116, bonding layer 118, and portions of dies 102C and 102B. TVs 124 may be electrically connected to conductive features in dies 102B and/or 102C. In some embodiments, forming TVs 124 includes a damascene process as described above. In such embodiments, a planarization process (e.g., CMP, etch back, grinding, or the like) may be applied so that top surfaces of TVs 124 and dielectric material 804 are substantially level.

Figure 30:
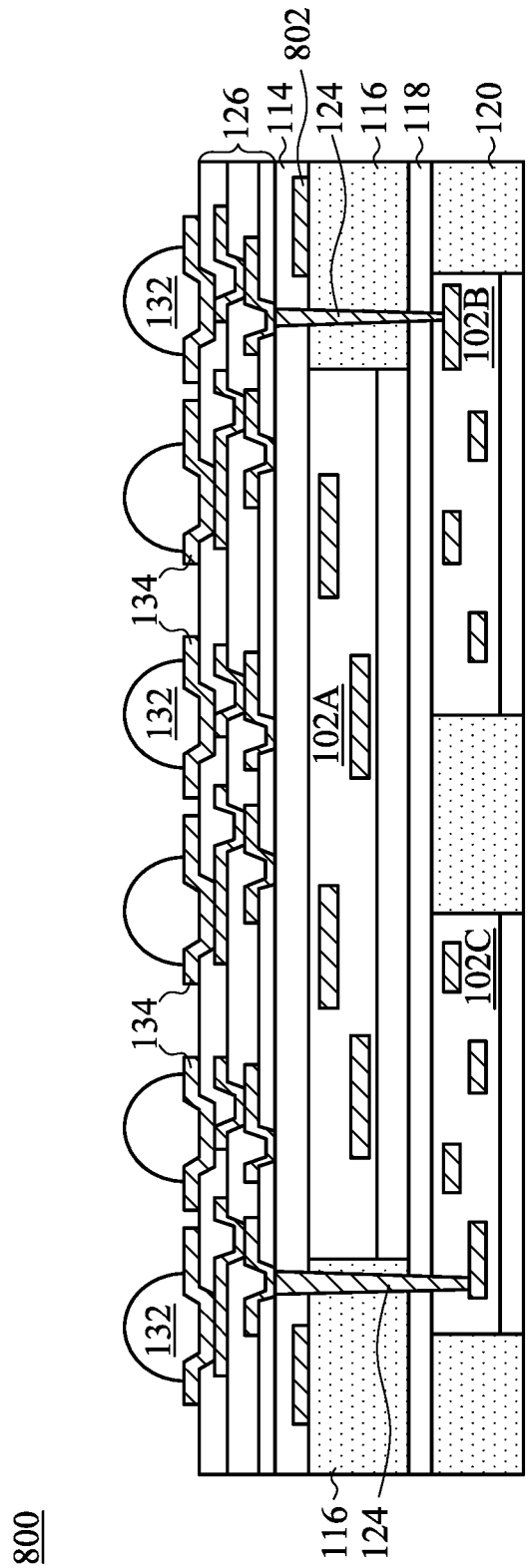

After TVs 124 are formed, various additional features, such as, RDLs 126, UBMs 134, and connectors 132 are formed over dies 102A, 102B, and 102C as described above. RDLs 126 may extend past edges of die 102A onto a top surface of isolation material 116. RDLs 126 may be electrically connected to die 102A as well as dies 102B and 102C (e.g., by TVs 124). External connectors 132 are electrically connected to dies 102A, 102B, and 102C by RDLs 126. Carrier 122 may be removed, and the resulting structure is illustrated in FIG. 30. Alternatively, a portion of carrier 122 may remain as a heat dissipation feature.

FIGS. 31 through 35 illustrate cross-sectional views of intermediary stages of forming a semiconductor package 900 in accordance with an embodiment. Package 900 may be similar to package 100 where like reference numerals indicate like elements. As illustrated in FIG. 31, two dies 102A and 102B are attached to a carrier 112 by a release film 114. Other embodiments may include any number of dies attached to a carrier. An isolation material 116 is formed around dies 102A and 102B as described above. Top surfaces of isolation material 116 and dies 102A/102B may be substantially level so that conductive features 110A and 110B as well as ILD/IMD layers 108A and 108B of dies 102A and 102B are exposed at a top surface of package 900.

Referring next to FIG. 32, a third die 102C is bonded directly to dies 102A and 102B without an additional, intermediary bonding layer (e.g., bonding layer 118, see FIG. 4). Die 102C may be bonded to die 102B and 102A using a hybrid bonding process as described above. In the hybrid bonding process, conductive features 110C of die 102C are contacted to and directly bonded to conductive features 110A and 110B of dies 102A and 102C. ILD/IMD layers 108C of die 102C is also contacted and directly bonded to ILD/IMD layers 108A and 108B of dies 102A and 102B. Thus, die 102C may be electrically connected to dies 102A and 102B. Furthermore, at least a portion of die 102C may contact isolation material 116, such as portions of isolation material 116 between dies 102A and 102B. After die 102C is bonded, a thinning process as described above may be applied so that die 102C is a desired thickness.

Next in FIG. 33, an isolation material 120 is formed around die 102C and over isolation material 116, die 102A, and die 102B. Isolation material 120 may be formed of a similar material and using a similar process as described above. Isolation materials 116 and 120 may or may not comprise a same material. Although a non-conformal isolation material 120 is illustrated, in other embodiments, isolation material 120 may be a conformal layer. As further illustrated by FIG. 33, TVs 124 are formed extending through isolation material 120 and optionally portions of dies 102A and 102B. TVs 124 may be electrically connected to conductive features 110A and 110B in dies 102A and 102B. In some embodiments, TVs 124 may be formed using a damascene process as described above.

In FIG. 34, redistribution lines 902 may be optionally formed over isolation material 120 and TVs 124. Redistribution lines 902 are electrically connected to TVs 124 in order to route electrical signals to a desired area of package 900 based on package design. In some embodiments, forming redistribution lines 902 includes depositing a seed layer (not shown), using a mask layer (not shown) having various openings to define the shape of redistribution lines 902, and filling the openings in the mask layer using an electrochemical plating process, for example. The mask layer and excess portions of the seed layer may then be removed.

Figure 35:
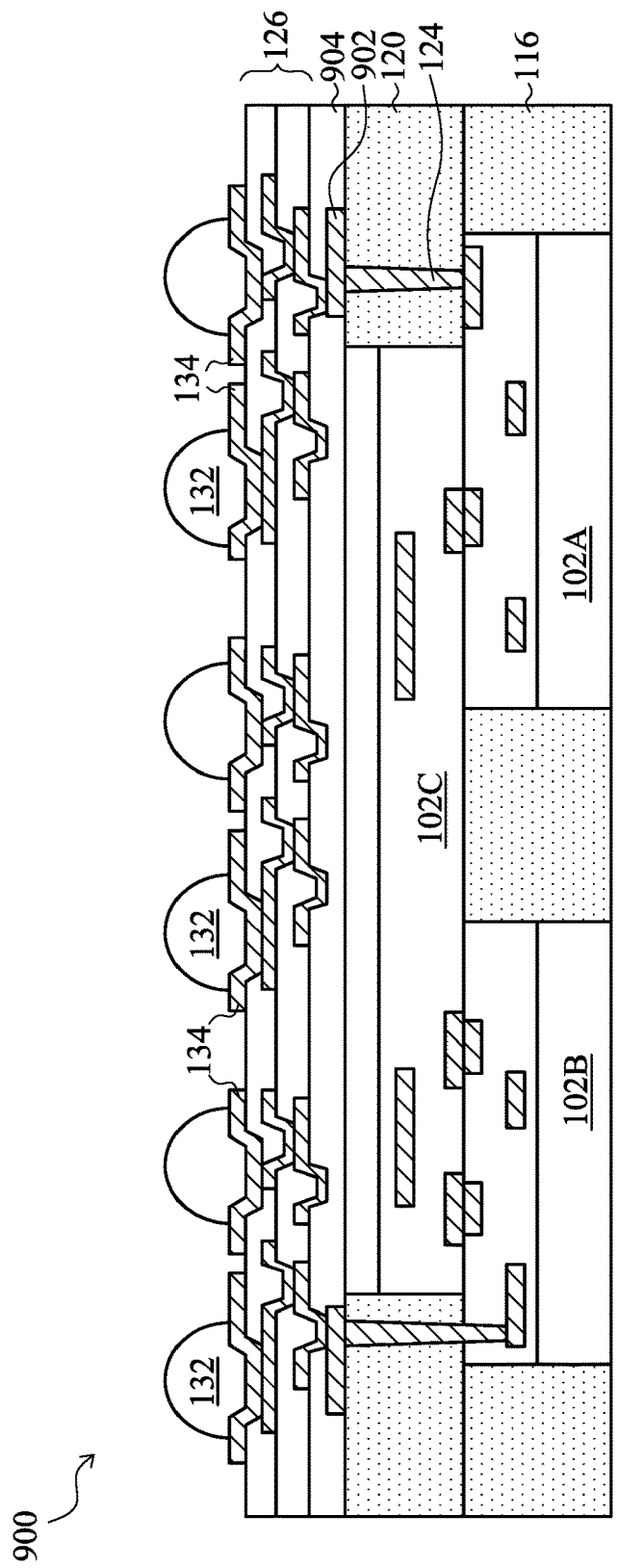

After redistribution lines 902 are formed, an insulation layer 904 (e.g., a dielectric or polymer layer) may be formed around redistribution lines 902 as illustrated in FIG. 35. Insulation layer 904 may be deposited using any suitable process such as a spin-on process, CVD, PECVD, and the like. Various additional features, such as, RDLs 126, UBMs 134, and connectors 132 may also be formed over redistribution lines 902, dies 102A, 102B, and 102C as described above. RDLs 126 may extend past edges of die 102A over a top surface of isolation material 120. RDLs 126 may be electrically connected to die 102A as well as dies 102B and 102C (e.g., by TVs 124 and redistribution lines 902). External connectors 132 are electrically connected to dies 102A, 102B, and 102C by RDLs 126. Carrier 112 may be removed, and the resulting structure is illustrated in FIG. 35.

FIGS. 36A and 36B illustrate cross-sectional views of packages 1000A and 1000B according to some embodiments. Packages 1000A and 1000B may be similar to package 900 where like reference numerals indicate like elements. Packages 1000A and 1000B include dummy dies 202 adjacent one or more functional device dies (e.g., dies 102A and 102B) as described above. Dummy dies 202 may be included, for example, by attaching dummy dies 202 to carrier 112 (see FIG. 31) prior to forming isolation material 116. In the embodiment package 1000A illustrated by FIG. 35A, dummy die 202 has a same thickness as dies 102A/102B. In the embodiment package 1000B illustrated by FIG. 35B, dummy die 202 has a different thickness than dies 102A/102B. In package 1000A, bonding layer 206 may be used to bond dummy die 202 to die 102C using a fusion bonding process or hybrid bonding process, for example. In package 1000B, a portion of isolation material 116 may extend over a top surface (e.g., layer 206). In some embodiments, dummy dies 202 are included for improved uniformity in a device layer, which may result in improved planarization. Dummy dies 202 may also be included to reduce CTE mismatch amongst various features in packages 1000A and 1000B.

Figure 37:
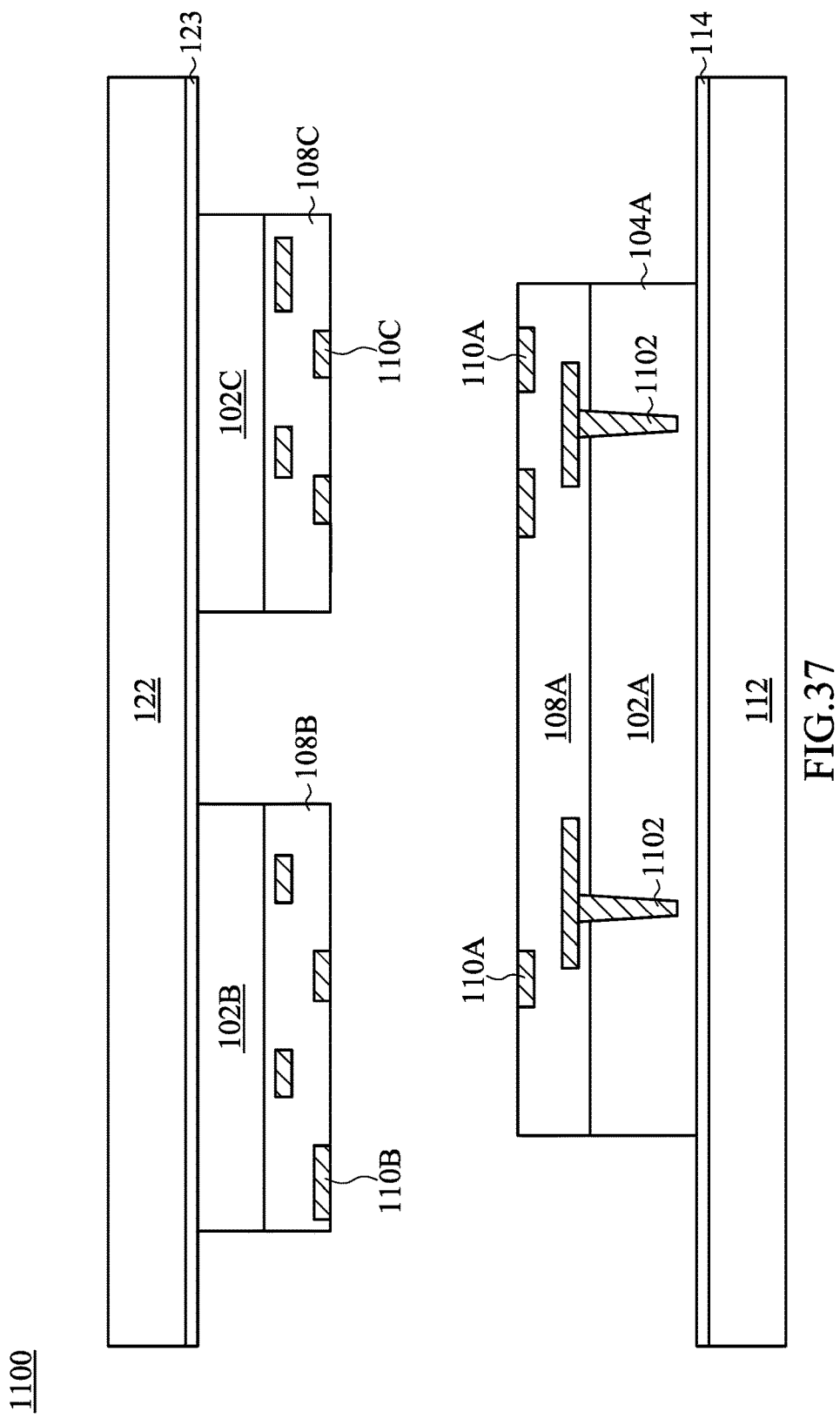

FIGS. 37 through 42 illustrate cross-sectional views of intermediary stages of forming a semiconductor package 1100 in accordance with an embodiment. Package 1100 may be similar to package 900 where like reference numerals indicate like elements. As illustrated in FIG. 37, a die 102A is attached to a first carrier 112 by a release film 114. Conductive features 110A and ILD/IMD layers 108A of die 102A may be exposed. Die 102A may further include TVs 1102, which may partially extend through substrate 104A of die 102A. TVs 1102 may be electrically connected to conductive features in die 102A.

As also illustrated by FIG. 37, two dies 102A and 102B are attached to a second carrier 122 by a release layer 123. Conductive features 110B and 110C as well as ILD/IMD layers 108B and 108C of dies 102B and 102C may be exposed. Carriers 112 and 122 may be used to position dies 102A, 102B, and 102C so that a front side of die 102A faces front sides of dies 102B and 102C. Carriers 112 and 122 may further be positioned so at least a subset of conductive features 110A, 110B, and 110B are aligned.

Figure 38:
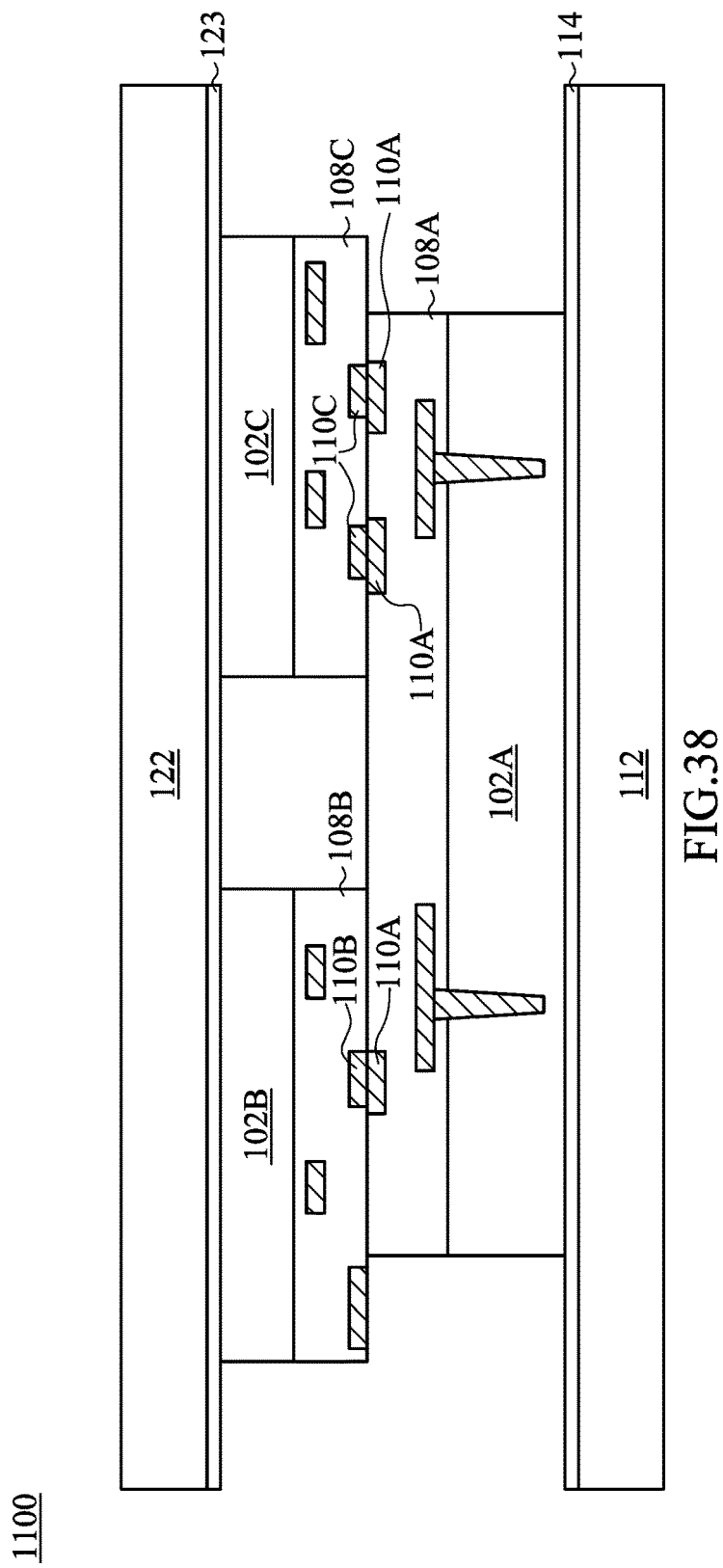

Referring next to FIG. 38, dies 102A, 102B, and 102C are bonded using a hybrid bonding process as described above. In the hybrid bonding process, conductive features 110A of die 102A are contacted to and directly bonded to conductive features 110B and 110C of dies 102B and 102C. ILD/IMD layers 108A of die 102A is also contacted and directly bonded to ILD/IMD layers 108B and 108C of dies 102B and 102C. Thus, die 102A may be electrically connected to dies 102B and 102C. Subsequently, carrier 122 may be removed.

Next, in FIG. 39, an isolation material 116 is formed around dies 102A, 102B, and 102C. In an embodiment, isolation material 116 is a molding compound and is formed around dies 102A, 102B, and 102C using a molding process as described above. After isolation material 116 is deposited, a planarization process (e.g., grinding, CMP, etch back, or the like) may be applied so that top surfaces of dies 102B and 102C are substantially level.

After isolation material 116 is formed, a third carrier 1104 may be attached to die 102B, die 102C, and isolation material 116 by a release layer 1106 as illustrated by FIG. 40. Carrier 1104 and release layer 1106 may be substantially similar to carrier no and release layer 112 as described above. For example, carrier 1104 may comprise glass, ceramic, bulk silicon, or the like while release layer 1106 comprises a DAF, a dielectric material, or the like. After carrier 1104 is attached, the first carrier 112 may be removed from surfaces of die 102A and isolation material 116. Removing the carrier 112 may include applying UV radiation to release layer 114, a mechanical grinding process, an etch back process, combinations thereof, or the like. After carrier 112 is removed, substrate 104A may also be etched back using a suitable process (e.g., etching, CMP, and the like) to expose TVs 1102. The resulting structure is illustrated in FIG. 40.

In FIG. 41, TVs 124 are formed extending through isolation material 116 and optionally portions of dies 102B and 102C. TVs 124 may be electrically connected to conductive features 110B and 110C in dies 102B and 102C. In some embodiments, TVs 124 may be formed using a damascene process as described above. Redistribution lines 902 may also be optionally formed over isolation material 116 and TVs 124 and 1102. Redistribution lines 902 are electrically connected to TVs 124 in order to route electrical signals to a desired area of package 900 based on package design. In some embodiments, forming redistribution lines 902 includes depositing a seed layer (not shown), using a mask layer (not shown) having various openings to define the shape of redistribution lines 902, and filling the openings in the mask layer using an electro-chemical plating process, for example. The mask layer and excess portions of the seed layer may then be removed.

Figure 42:
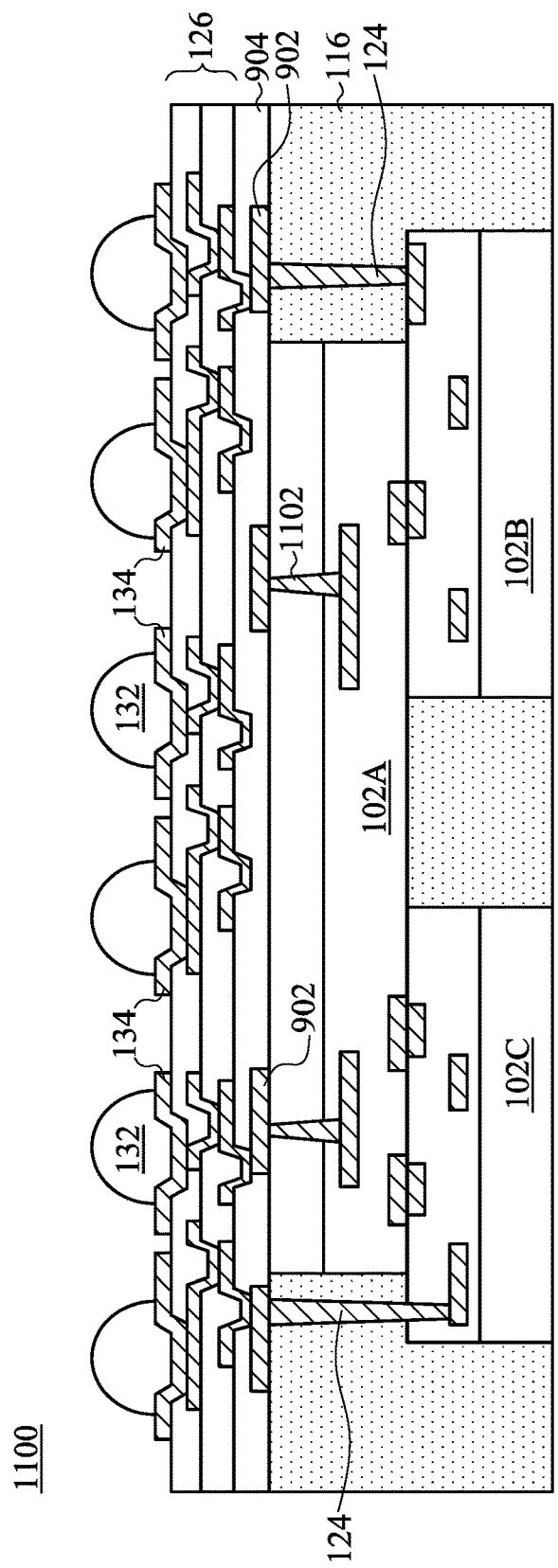

After redistribution lines 902 are formed, an insulation layer 904 (e.g., a dielectric or polymer layer) may be formed around redistribution lines 902 as illustrated in FIG. 42. Insulation layer 904 may be deposited using any suitable process such as a spin-on process, CVD, PECVD, and the like. Various additional features, such as, RDLs 126, UBMs 134, and connectors 132 may also be formed over redistribution lines 902, dies 102A, 102B, and 102C as described above. RDLs 126 may extend past edges of die 102A over a top surface of isolation material 120. RDLs 126 may be electrically connected to die 102A (e.g., by TVs 1102) as well as dies 102B and 102C (e.g., by TVs 124 and redistribution lines 902). External connectors 132 are electrically connected to dies 102A, 102B, and 102C by RDLs 126. Carrier 1104 may be removed, and the resulting structure is illustrated in FIG. 42.

FIGS. 43 through 50 illustrate cross-sectional views of intermediary stages of forming a semiconductor package 1200 in accordance with an embodiment. Package 1200 may be similar to package 1100 where like reference numerals indicate like elements. As illustrated in FIG. 43, dies 102A and 102B are attached to a first carrier 112 by a release film 114. Dies 102A and 102B may be disposed so that a front surface is facedown and contacts release film 114. For example, substrates 104A and 104B of dies 102A and 102B, respectively, are exposed in this orientation. Dies 102A and 102B may further include TVs 1102A and 1102B, respectively. TVs 1102A and 1102B may partially extend through substrate 104A of die 102A and substrate 104B of die 102B, respectively. TVs 1102A and 1102B may be electrically connected to conductive features in dies 102A and 102B, respectively.

Next, in FIG. 44, a thinning process is applied to remove portions of substrates 104A and 104B over TVs 1102A and 1102B. The thinning process may include any suitable planarization process, such as, CMP, grinding, etch-back, and the like. The thinning process exposes TVs 1102A and 1102B, and in some embodiments, the thinning process further reduces a total thickness of dies 102A and 102B to a desired thickness as described above.

Figure 45:
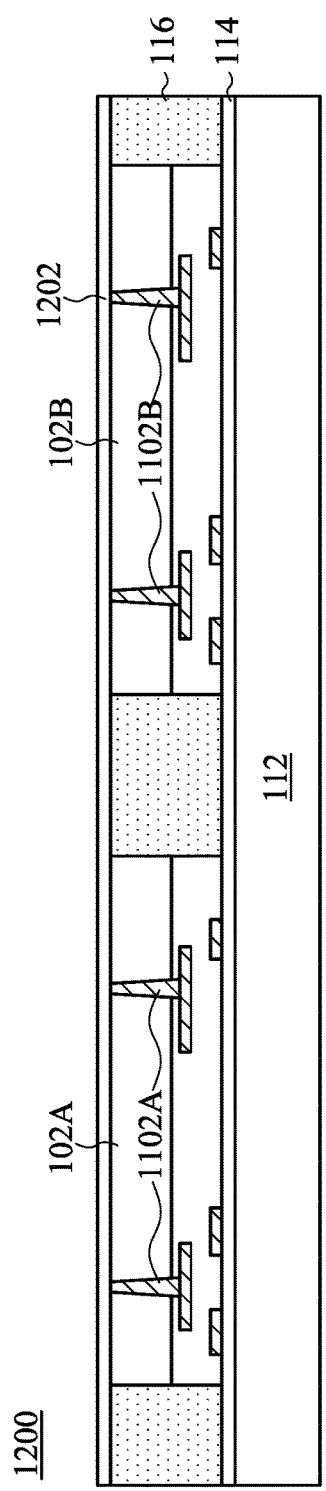

Referring next to FIG. 45, an isolation material 116 is formed around dies 102A and 102B. In an embodiment, isolation material 116 is a dielectric material (e.g., an oxide, nitride, oxynitride, and the like), a polymer, or a molding compound as described above. After isolation material 116 is deposited, a planarization process (e.g., grinding, CMP, etch back, or the like) may be applied so that top surfaces of molding compound 116, die 102A, and die 102B are substantially level. Subsequently, a dielectric layer 1202 is formed over isolation material 116, die 102A, and die 102B. Dielectric layer 1202 may be used to protect features of dies 102A and 102B during subsequent processing.

Figure 46:
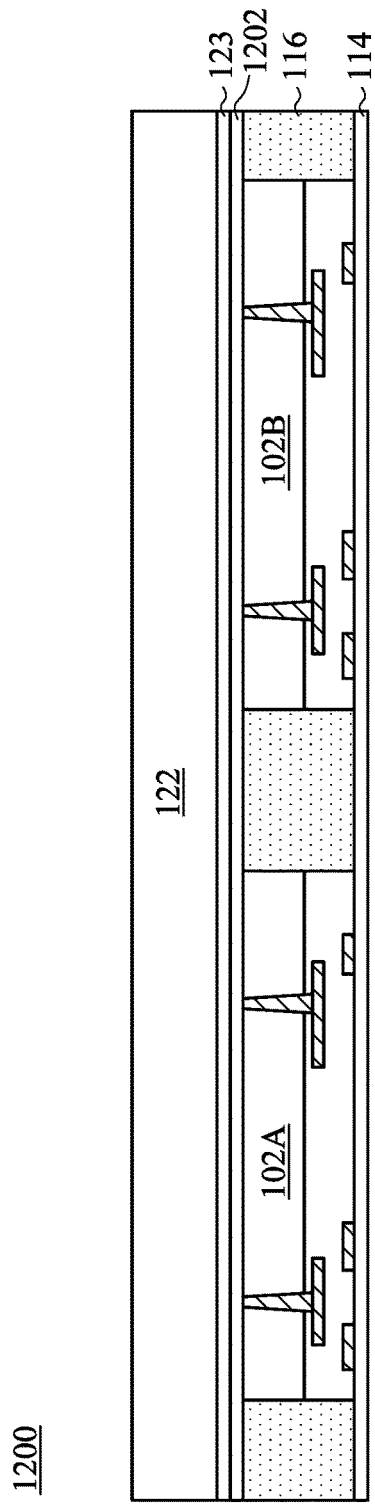

In FIG. 46, a second carrier 122 may be attached to dielectric layer 1202, die 102A, die 102B, and isolation material 116 by a release layer 123. After carrier 122 is attached, the first carrier 112 may be removed from surfaces of die 102A, die 102B and isolation material 116. In some embodiments, release layer 114 may remain in package 1200 even after carrier 112 is removed. For example, release layer 114 may comprise a dielectric material, and carrier 112 may be removed using an etch back process, CMP, grinding, or the like.

Figure 47:
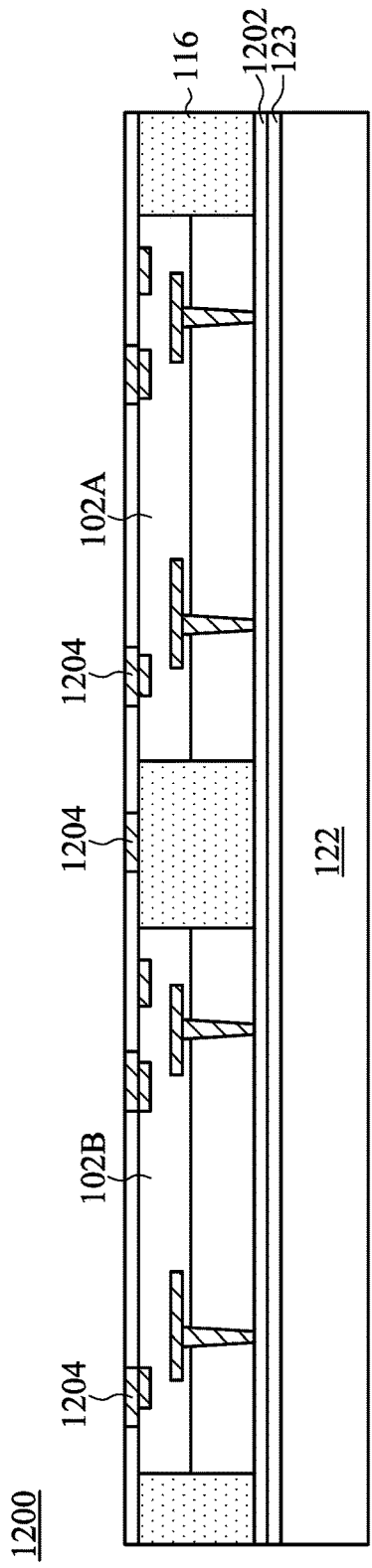

In FIG. 47, redistribution lines 1204 are formed in release layer 114. Redistribution lines 1204 are electrically connected to conductive features in dies 102A and 102B in order to route electrical signals to a desired area of package 1200 based on package design. In some embodiments, forming redistribution lines 1204 includes depositing a seed layer (not shown), using a mask layer (not shown) having various openings to define the shape of redistribution lines 1204, and filling the openings in the mask layer using an electrochemical plating process, for example. The mask layer and excess portions of the seed layer may then be removed.

Figure 48:
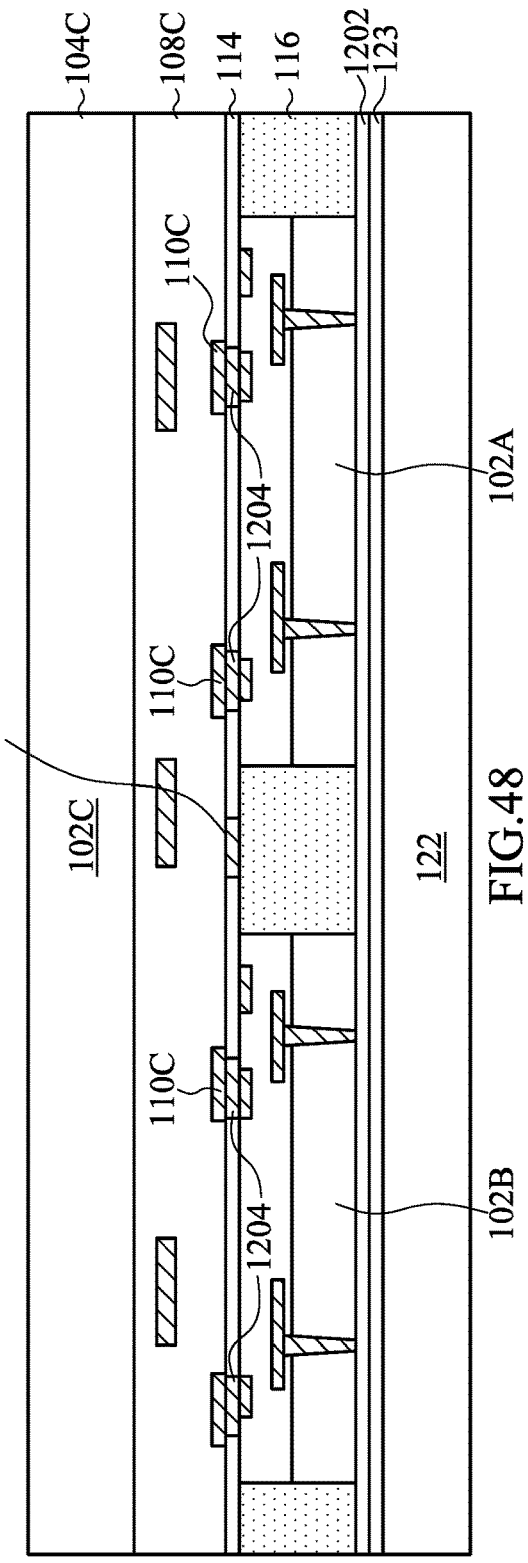

After redistribution lines 1204 are formed, an additional die 102C is bonded to dies 102A and 102B as illustrated in FIG. 48. In some embodiments, die 102C may be an entire wafer (e.g., prior to singulation), and dies 102A and 102B may be bonded using a chip on wafer (CoW) bonding process and/or a wafer on wafer (WoW) bonding process. The wafer may be a re-constructed wafer in an embodiment. The bonding process may further include a fusion bonding process as described above where conductive features 110C of die 102C is directly bonded to redistribution lines 1204. The fusion bonding process may further include directly bonding ILD/IMD layers 108C to release layer 114. A portion of redistribution lines 1204 (e.g., 1204') may remain unbonded after bonding die 102C. Although FIG. 48 illustrates a single die, in other embodiments multiple dies can be attached to dies 102A and 102B. Furthermore, although die 102C is illustrated as spanning an entire width of package 1200 (e.g., having sidewalls substantially aligned with sidewalls of isolation material 116), in other embodiments die 102C may have a different size. In such embodiments, an isolation material (not shown) may or may not be formed around die 102C.

Figure 49:
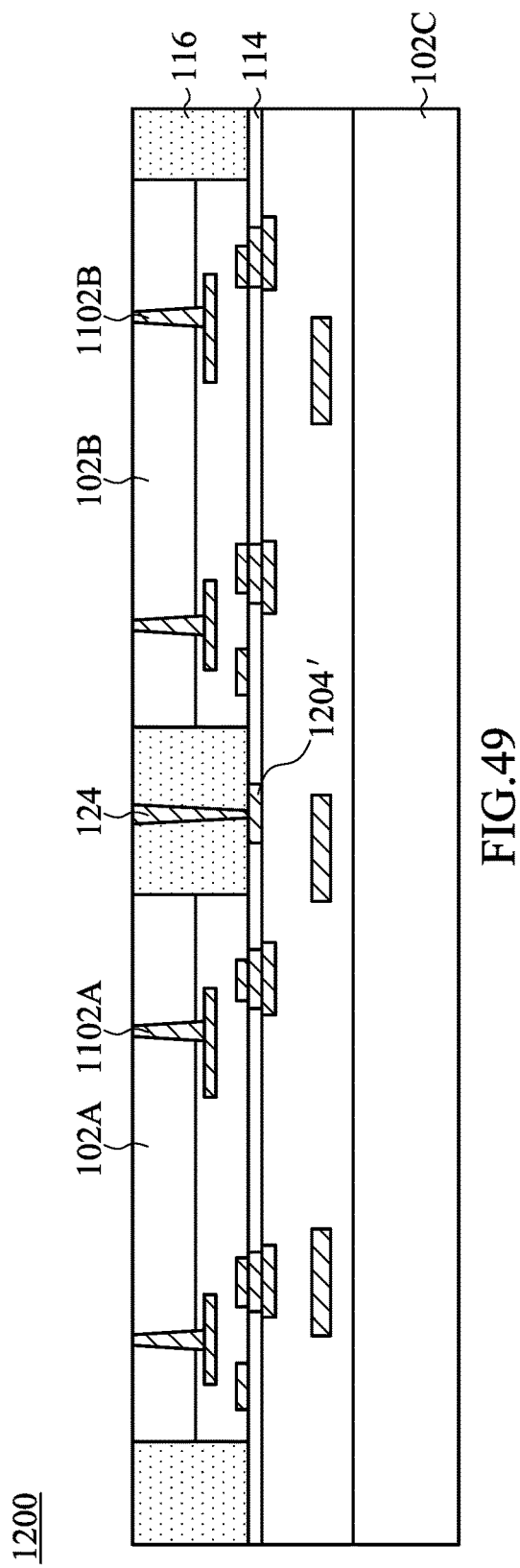

Subsequently, an orientation of package 1200 is flipped so that dies 102A and 102B are disposed over die 102C. Carrier 122 and release layer 123 may also be removed as described above. In some embodiments, die 102C is used as structural support for further processing to package 1200. The resulting package is illustrated in FIG. 49. A cleaning process may also be applied to package 1200 after carrier 122 is removed, and TVs 1102A/1102B may be exposed, for example, by removing dielectric layer 1202. As also illustrated in FIG. 49, TVs 124 may be formed extending through isolation material 116 to electrically connect to redistribution lines 1204 (e.g., redistribution line 1204') in release layer 114. In some embodiments, TVs 124 may be formed using a damascene process as described above.

Figure 50:
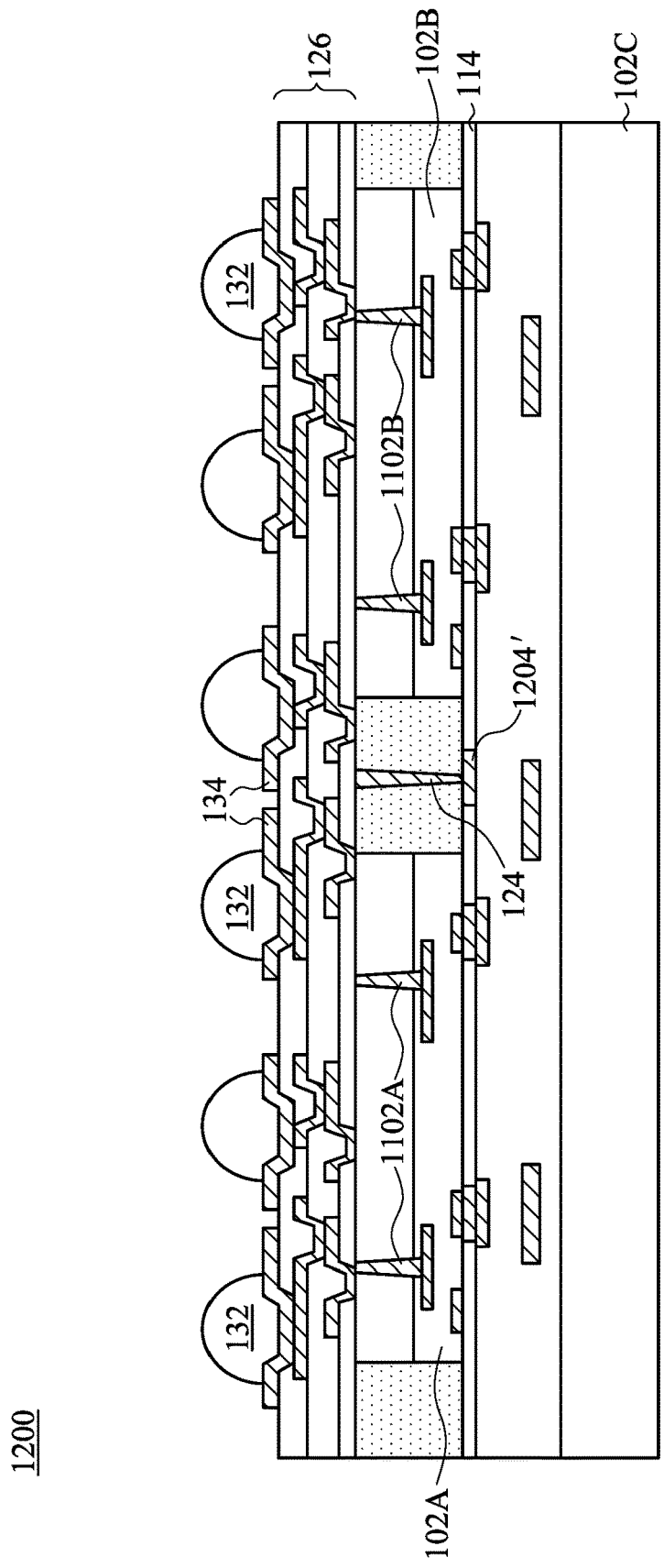

Various additional features, such as, RDLs 126, UBMs 134, and connectors 132 may also be formed over dies 102A, 102B, and 102C as described above. FIG. 50 illustrates the resulting structure. RDLs 126 may extend past edges of die 102A over a top surface of isolation material 116. RDLs 126 may be electrically connected to dies 102A and 102B (e.g., by TVs 1102A/1102B) as well as die 102C (e.g., by TVs 124). External connectors 132 are electrically connected to dies 102A, 102B, and 102C by RDLs 126.

Figure 51:
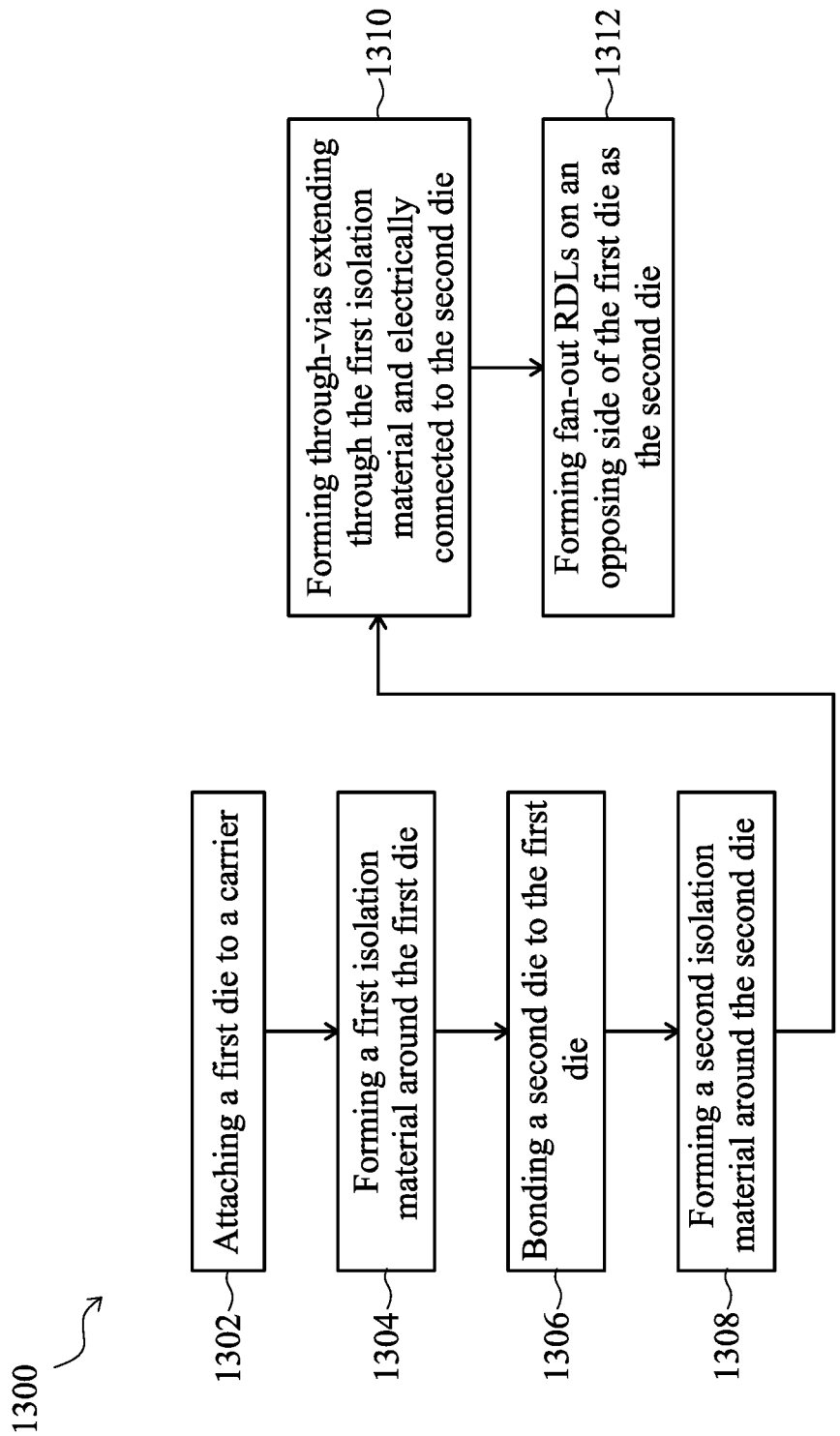
FIG. 51 illustrates a process flow for forming a semiconductor package in accordance with some embodiments.

FIG. 51 illustrates a process flow 1300 for forming a semiconductor package in accordance with some embodiments. In step 1302, a first die (e.g., die 102A) is attached to a first carrier (e.g., carrier 112). In step 1304, a first isolation material (e.g., isolation material 116) is formed around the first die. In step 1306, a second die (e.g., die 102B or 102C) is bonded to the first die. Bonding the second die includes a hybrid bonding or fusion bonding process where a dielectric-to-dielectric bond is formed. A conductor-to-conductor bond may also be formed in some embodiments. The second die may be bonded to a bonding layer formed over the first die and the first isolation material or directly to the first die after the first isolation material is formed. In step 1308, a second isolation material (e.g., isolation material 120) is formed around the second die. The second isolation material may or may not be a conformal layer, and a third (optional) isolation material may be formed on and contacting the second isolation material. In another embodiment, the second die is bonded to the first die directly prior to forming any isolation materials, and then an isolation material may be formed around both the first die and the second die simultaneously. After forming the second isolation material, the first carrier may be removed. In step 1310, a through via (e.g., TV 124) may be formed extending through the first isolation material and electrically connected to the second die. In step 1312, fan-out RDLs (e.g., RDLs 126) may be formed on an opposing side of the first die as the second die. The fan-out RDLs are electrically connected to the first die and the second die (e.g., through the through-via).

As described above, embodiment methods and corresponding packages includes bonding various dies in a device package using fusion bonding and/or hybrid bonding processes. For example, various embodiment packages may provide one or more of the following non-limiting features: a CoW structure integrating KGDs, flexible chip size integration, heterogeneous and/or homogeneous multi-chip stacks, and a relatively small form factor package. Thus, various embodiments may provide one or more of the following non-limiting advantages: lower aspect ratio vias, KGD with split or partition chips to reduce manufacturing cost, reduced use of microbumps or underfill processes for bonding to reduce manufacturing cost thing chip stacking and multi-chip stacking, flexible chip size stacking, enhanced signal transmission performance, smaller form factor, higher I/O count density, and implementing chip to wafer or wafer to wafer bonding processes.

In accordance with an embodiment, method for forming a semiconductor package includes attaching a first die to a first carrier, depositing a first isolation material around the first die, and after depositing the first isolation material, bonding a second die to the first die. Bonding the second die to the first die includes forming a dielectric-to-dielectric bond. The method further includes removing the first carrier and forming fan-out redistribution layers (RDLs) on an opposing side of the first die as the second die. The fan-out RDLs are electrically connected to the first die and the second die.

In accordance with another embodiment, a method includes attaching a first die to a first carrier, forming a first isolation material extending along sidewalls of the first die, and forming a bonding layer over the first die and the first isolation material. The method further includes bonding a second die directly to the bonding layer, forming a second isolation material extending along sidewalls of the second die, and attaching a second carrier over the second die. The method also includes removing the first carrier, forming a through via extending through the first isolation material and electrically connected to the second die, and forming fan-out redistribution layers (RDLs) on an opposing side of the first die as the second die. The fan-out RDLs are electrically connected to the first die and the through via.

In accordance with yet another embodiment, a semiconductor package includes a first die, a first isolation material disposed around the first die, a bonding layer over the first die and the first isolation material, and a second die directly bonded to the bonding layer. The second die includes a conductive feature disposed in a dielectric layer. The package further includes a second isolation material disposed around the second die, a through via extending through the first isolation material and the bonding layer to contact the conductive feature in the second die, and fan-out redistribution layers (RDLs) on an opposing side of the first die as the second die. The fan-out RDLs are electrically connected to the first die and the through via The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package comprising:
a first die;
a first isolation material disposed around the first die;
a bonding layer over the first die and the first isolation material;
a second die directly bonded to the bonding layer, wherein the second die comprises a conductive feature disposed in a dielectric layer;
a second isolation material disposed around the second die;
a through via extending through the first isolation material and the bonding layer to contact the conductive feature in the second die; and
fan-out redistribution layers (RDLs) on an opposing side of the first die as the second die, wherein the fan-out RDLs are electrically connected to the first die and the through via.

2. The semiconductor package of claim 1, wherein a lateral portion of the second isolation material on the bonding layer has a same thickness as a vertical portion of the second isolation material on a sidewall of the second die.

3. The semiconductor package of claim 2, further comprising a carrier attached to the second isolation material, wherein a cavity is disposed between the carrier and the second isolation material.

4. The semiconductor package of claim 1 further comprising a third isolation material contacting the second isolation material, wherein the third isolation material has a different material composition than the second isolation material, and wherein the third isolation material surrounds the second die.

5. The semiconductor package of claim 1, wherein the first isolation material comprises an oxide, a nitride, an oxynitride, a molding compound, a polymer, or a combination thereof.

6. The semiconductor package of claim 1 further comprising a third die adjacent the second die, wherein the second isolation material is disposed around the third die, and wherein the fan-out RDLs are electrically connected to a second conductive feature disposed in the third die.

7. The semiconductor package of claim 6 further comprising a dummy die disposed between the second die and the third die, wherein the second isolation material is disposed around the dummy die.

8. The semiconductor package of claim 7, wherein a first height of the dummy die is less than a second height of the second die.

9. A package comprising:
a first semiconductor die;
a second semiconductor die disposed over and directly bonded to the first semiconductor die using a first dielectric-to-dielectric interface;
a third semiconductor die disposed over and directly bonded to the first semiconductor die using a second dielectric-to-dielectric interface, wherein the third semiconductor die is adjacent the second semiconductor die and spaced a lateral distance away from the second semiconductor die, and wherein the first semiconductor die spans the lateral distance between the second semiconductor die and the third semiconductor die;
an isolation material disposed around the second semiconductor die and the third semiconductor die; and
redistribution layers electrically connected to the first semiconductor die, the second semiconductor die, and the third semiconductor die.

10. The package of claim 9, wherein the redistribution layers are disposed on an opposing side of the first semiconductor die as the second semiconductor die and the third semiconductor die.

11. The package of claim 9, wherein the redistribution layers are disposed on an opposing side of the second semiconductor die as the first semiconductor die.

12. The package of claim 9 further comprising a conductive via extending continuously from the redistribution layers to a conductive feature in the second semiconductor die, wherein a portion of the isolation material is disposed between the first semiconductor die and the conductive via along a line parallel to the first dielectric-to-dielectric interface.

13. The package of claim 9 wherein the first semiconductor die comprises a through via extending through a semiconductor substrate and contacting a conductive feature in the redistribution layers.

14. The package of claim 9, wherein a conductive feature in the second semiconductor die is directly bonded to a conductive feature in the first semiconductor die.

15. The package of claim 9 further comprising a dummy die between the second semiconductor die and the third semiconductor die.

16. A package comprising:
- a first semiconductor die;
- a second semiconductor die adjacent the first semiconductor die;
- a first insulating material disposed around the first semiconductor die and the second semiconductor die;
- a second insulating material disposed over the first semiconductor die, the second semiconductor die, and the first insulating material;
- a third semiconductor die over and contacting an opposing surface of the second insulating material as the first semiconductor die; and
- redistribution layers electrically connecting the first semiconductor die, the second semiconductor die, and the third semiconductor die.

17. The package of claim 16 further comprising conductive features in the second insulating material and electrically connected to the first semiconductor die, the second semiconductor die, and the third semiconductor die.

18. The package of claim 16, wherein the redistribution layers are disposed on an opposing side of the first semiconductor die as the second insulating material.

19. The package of claim 16 further comprising a conductive via extending through the first insulating material to contact a conductive feature in the second insulating material.

20. The package of claim 19, wherein the conductive via is disposed between the first semiconductor die and the second semiconductor die along a line parallel to an interface between the second insulating material and the first semiconductor die.

* * * * *